(12) United States Patent
Yap et al.

(10) Patent No.: US 7,835,600 B1
(45) Date of Patent: Nov. 16, 2010

(54) MICROWAVE RECEIVER FRONT-END ASSEMBLY AND ARRAY

(75) Inventors: Daniel Yap, Newbury Park, CA (US); James H. Schaffner, Chatsworth, CA (US); Daniel F. Sievenpiper, Los Angeles, CA (US); Kevin Geary, Los Angeles, CA (US); Willie W. Ng, Agoura Hills, CA (US); Daniel J. Gregoire, Thousand Oaks, CA (US); Joseph S. Colburn, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 153 days.

(21) Appl. No.: 12/176,071

(22) Filed: Jul. 18, 2008

(51) Int. Cl.
*G02B 6/00* (2006.01)
*G02F 1/01* (2006.01)
*G02B 6/34* (2006.01)

(52) U.S. Cl. .................. 385/12; 385/1; 385/37
(58) Field of Classification Search ........... 385/1–10, 385/12, 37, 43
See application file for complete search history.

(56) References Cited

U.S. PATENT DOCUMENTS

| | | | |
|---|---|---|---|
| 4,541,120 A * | 9/1985 | Szabo | 455/86 |
| 5,076,622 A | 12/1991 | Bridges | |
| 5,076,655 A * | 12/1991 | Bridges | 385/3 |
| 5,291,565 A * | 3/1994 | Schaffner et al. | 385/3 |
| 6,703,596 B1 | 3/2004 | Moran | |
| 6,724,523 B2 | 4/2004 | Yap | |
| 7,260,280 B2 | 8/2007 | Ichioka et al. | |
| 7,486,247 B2 * | 2/2009 | Ridgway et al. | 343/767 |
| 7,657,132 B1 * | 2/2010 | Yap et al. | 385/10 |

OTHER PUBLICATIONS

Betts, G.E., et al., "High-Sensitivity Bandpass RF Modulator in LiNb03," SPIE Integrated Optical Circuit Engineering VI, vol. 993, pp. 110-116 (1988).
Cho, et al., IEEEE Journal of Quantum Electronics, vol. QE-13, No. 4, pp. 206-208 (Apr. 1977).
Cohn, S.B., et al.,"Optimum Design of Stepped Transmission-line Transformers," IRE Trans. Microwave Theory Tech., vol. 3, No. 3, pp. 16-20 (Apr. 1955).
Cutolo, et al., Applied Physics Letters, vol. 71, No. 2, pp. 199-201 (Jul. 14, 1997).
Emerson and Cumming Microwave Products, Eccostock HiK500F data sheet, www.eccosorb.com, rev. May 11, 2007.

(Continued)

*Primary Examiner*—Rhonda S Peace
(74) *Attorney, Agent, or Firm*—Ladas & Parry

(57) ABSTRACT

A method of and apparatus for modulating an optical carrier by an incident electromagnetic field. The electromagnetic field propagates in a dielectric-filled transverse electromagnetic waveguide. At least one slice of an electro-optic material is disposed in the dielectric-filled transverse electromagnetic waveguide, the electro-optic material in the dielectric-filled transverse electromagnetic waveguide having at least one optical waveguide therein which has at least a major portion thereof guiding light in a direction orthogonal with respect to a direction in which the dielectric-filled transverse electromagnetic waveguide guides the incident electromagnetic field. Light is caused to propagate in the at least one optical waveguide in the at least one slice of an electro-optic material in the dielectric-filled transverse electromagnetic waveguide for modulation by the incident electromagnetic field.

26 Claims, 14 Drawing Sheets

OTHER PUBLICATIONS

Farwell, et al., IEEE Photonics Technology Letters, vol. 5, No. 7, pp. 779-782 (Jul. 1993).

Ghatak, A.K., et al., "Optical Electronics," pp. 441-447, Cambridge University Press, 1989.

Hsu, R.C., et al., "All-dielectric photonic-assisted radio front-end technology," Nature Photonics, vol., pp. 535-538 (Sep. 2007).

Johnson, et al., IEEE Photonics Techn. Letters, vol. 2, No. 11, pp. 810-811 (Nov. 1990).

Khurgin, et al., Optical Letters, vol. 25, pp. 70-72 (2000).

Kim, et al., Electronics Letters, vol. 41, No. 18 (Sep. 1, 2005).

Lee, R.T., et al., "A design study for the basic TEM horn antenna," IEEE Antennas and Propagation Magazine, vol. 46, No. 1, pp. 86-92 (Feb. 2004).

1b.LINX Technologies RXM-900-HP-II RF Module specification-www.linxtechnologies.com.

1c. MAXIM, Receiver Sensitivity Equation for Spread Spectrum Systems, MAXIM application note 1140, Jun. 28, 2002 www.maxim-ic.com/an1140.

Morito, K., et al., "A Broad-Band MQW Semiconductor Optical Amplifier with High Saturation Output power and Low Noise Figure," IEEE Photon. Technol. Lett. vol. 17, No. 5, pp. 974-976 (May 2005).

NAVSYNC CW20 GPS receiver specification—www.navsync.com.

Ruze. J., "Wide-Angle Metal Plate Optics," Proceedings of the I.R.E., vol. 38, No. 1, pp. 53-59 (Jan. 1950).

Shaw, et al., Electronics Letters, vol. 35, no. 18, pp. 1557-1558 ( Sep. 2, 1999).

Shi, W., et al., "Demonstration of Dual-Depletion-Region Electroabsorption modulator at 155 Wavelength for High Speed and Low Driving Voltage Performance," IEEE Photon. Technol. Lett., vol., 17, No. 10, pp. 2068-2070 (Oct. 2005).

Sun, et al., Electronic Letters, vol. 31, No. 11, pp. 902-903 (May 1995).

Taylor, Journal of Lightwave Technology, vol. 17, No. 10, pp. 1875-1883 (Oct. 1999).

Welstand, et al., IEEE Photonics Technology Letters, vol. 7, No. 7, pp. 751-753 (Jul. 1995).

Wood, L., "Opening Statement before the United States Senate committee on the Judiciary, Subcommittee on Terrorism," Mar. 8, 2005.

Bridges and Schaffner, IEEE Transactions on Microwave Theory and Techniques, vol. 43, No. 9, pp. 2184-2197 (Sep. 1995).

* cited by examiner

Optical grating modulator (wideband)

Plot of link sensitivity vs. equivalent-$V_\pi$ ($V_{\pi eq}$) of the Bragg grating modulator.

Phase modulator (low frequencies)

MICROWAVE RECEIVER FRONT-END ASSEMBLY AND ARRAY

CROSS REFERENCE TO RELATED APPLICATIONS

This application is related to the following U.S. patent applications: U.S. Ser. No. 12/141,825, filed on Jun. 18, 2008 and entitled "Optoelectronic modulator and electric-field sensor with multiple optical-waveguide gratings"; U.S. Ser. No. 12/141,834, filed on Jun. 18, 2008 and entitled "Enhanced Linearity RF Photonic Link"; U.S. Ser. No. 12/176,089, filed on the same date as this application and entitled "Parallel Modulator Photonic Link"; and U.S. Ser. No. 12/176,114, filed on the same date as this application and entitled "An RF Receiver Front-End Assembly". The disclosures of each of these related applications are hereby incorporated herein by reference.

TECHNICAL FIELD

Disclosed is a wideband electromagnetic (EM) field sensor assembly for a microwave receiver front end. The EM field sensor is sensitive to small microwave signal powers, and makes the front end also resistant to being damaged by unwanted high-power incident EM radiation. The assembly comprises a sensor head, which senses the incident EM radiation, with the sensor head being connected by means of one or more optical fibers to an enclosure of the front end, which can be shielded from incident EM radiation, containing additional electronic and optoelectronic components. The assembly can take the place of the antenna and microwave detector typically found in a receiver front end. Yet other components of the receiver front end also could be housed in the same optical-fiber connected enclosure, or they could be housed in separate enclosures. Since the only connections between the sensor head and the enclosure are the optical fibers, the receiver front end assembly is electrically isolated from the incident EM radiation and can be protected from damage by that incident radiation when the enclosure is EM shielded.

BACKGROUND

Many of today's sophisticated communication radio receivers are extremely sensitive and need to demodulate signals that are well below −100 dBm, that is, less than 100 fW. While this low signal threshold increases the range between the transmitter and the receiver, it also makes these receivers highly susceptible to destruction by high energy electromagnetic pulses. These high power transients can be caused on purpose, or could be accidental (e.g. from having the receiver cross the path of a high power radar beam) or could be a natural event (e.g., a lightning strike).

The adverse effect of high energy electromagnetic radiation on communication radios has been known for a long time. The usual protection against such high levels of EM radiation has either been fuses or component circuit breakers. Fuses, once activated, need to be replaced before the radio can operate again. Component circuit breakers such as semiconductor diodes or capacitive shunts are limited in the amount of current/voltage that can be shunted. Although it is possible to place most of the electronic components of the receiver front end inside EM shielded enclosures, prior receiver front ends still need to be electrically connected to the antenna. This electrical connection provides a path for the high-energy radiation to penetrate the enclosure.

An electrically insulating optical connection between an antenna and receiver electronics is described in an article by R. C. J. Hsu, A. Ayazi, B. Houshmand, and B. Jalali, "All-dielectric photonic-assisted radio front-end technology", *Nature Photonics*, vol. 1, September 2007, pp. 535-538). This prior art apparatus uses an electro-optic modulator to sense the level of the microwave signal coupled into a dielectric resonator antenna. The electro-optic modulator is part of an RF-photonic link that provides electrical isolation between the antenna and the rest of the microwave receiver front-end (which contains the sensitive radio components), thereby achieving tolerance to unwanted high power electromagnetic radiation. This prior approach is based on an electro-optic microdisk resonator (acting as the modulator) that is intimately in contact with the dielectric resonator antenna. Because of its resonant antenna, this prior art apparatus couples in substantial power from incident radiation at only those frequencies that match the resonant frequencies of the antenna. Nevertheless, despite its all dielectric construction, the power at those resonant frequencies is slowly absorbed by the dielectric antenna of this prior art apparatus over a characteristic time that is inversely proportional to the resonator linewidth. If that absorbed power is sufficiently high, it can damage or alter the antenna and the modulator.

Resonators (used for both the antenna and the modulator of this prior art apparatus) have very narrow bandwidth and can be operated only at particular frequencies. In contrast, the presently disclosed front-end sensor head makes use of a wideband, non-resonator antenna to capture and concentrate the incident radiation. It also uses optical-waveguide based electro-optic modulators that are built into a wide band transverse electromagnetic (TEM) waveguide. Such optoelectronic modulators, whether they involve distributed Bragg-reflector gratings or phase modulators in interferometric configurations, have much wider bandwidth than the microdisk resonators of the prior-art apparatus. The bandwidth of the presently disclosed front end can be greater than 5-10%, much larger than the bandwidth of less than 0.1% achieved with the prior art resonator-based approach.

The present disclosure involves an EM-field sensitive structure that does not need to absorb any incident EM energy. Instead, the incident EM radiation passes through the sensor head and exits the sensor head. Since the sensor assembly is electrically passive, very little RF power is actually absorbed, provided that low loss dielectric materials are used and provided the electric fields in the structure remain below the dielectric breakdown of the constituent filling materials. Thus, there is no need for fuses or component circuit breakers. In addition, since the only connection to the EM shielded enclosure of the front end comprises dielectric optical fibers of very small diameter, there is almost no path for penetration of any incident high-energy radiation into that shielded enclosure.

Some embodiments of the present disclosure involve an array of sensor-head elements, with each of those elements comprising an antenna, such as a TEM horn, coupled to a TEM waveguide that contains at least one electro-optic modulator. The prior art also includes U.S. Pat. No. 6,703,596 (entitled "Apparatus and System for Imaging Radio Frequency Electromagnetic Signals," invented by Joseph E. Moran) which teaches an apparatus and system for imaging radio frequency electromagnetic signals. In this prior antenna array, each antenna element in the antenna array is connected to a separate electro-optic modulator and also serves as the electrodes of the electro-optic modulator. These antenna elements do not act as microwave waveguides nor are they coupled to microwave waveguides that supply a modulating RF signal to the electro-optic modulator. In contrast, for the presently disclosed front end array, the electro-optic modulator in each array element is built into a TEM microwave waveguide that carries the modulating RF signal to electro-optic modulator located in a slice of that microwave waveguide. Thus, the presently disclosed integrated structure comprising TEM microwave (or RF) waveguide and electro-optic modulator is better able to withstand the high electric fields and high currents resulting from an incident high-energy EM pulse.

Some embodiments of the present disclosure involve an array of sensor-head elements containing multiple electro-optic modulators that are optically connected in series to increase the overall depth of modulation. A prior art electro-optic modulator that has multiple series-connected sections is described in U.S. Pat. No. 5,076,622 (entitled "Antenna-Fed Electro-optic Modulator," invented by William B. Bridges). This prior patent describes an RF waveguide that couples an EM field onto an array of printed-circuit electrodes. The printed-circuit electrodes, with one set of electrodes for each section of electro-optic modulator, act as a phased array of antenna elements that receive the EM field of the TEM RF waveguide. Those printed-circuit electrodes constrain the electric field that modulates the light propagating in the modulator. In contrast, for the present disclosure, the TEM RF waveguide itself constrains the electric field that modulates the light propagating in the modulator—there is no need for additional printed circuit electrodes. Thus, the presently disclosed integrated structure is better able to withstand the high electric fields and high currents resulting from an incident high-energy EM pulse.

In this prior art apparatus, the relative phase delay of the RF signals received by the array of electrodes is matched to the time delay of the light propagating in the series connection of electro-optic modulator sections. The desired relative phase delay is achieved by properly placing and aligning the array of electrodes within the RF waveguide such that EM field of the waveguide couples into those electrodes at successively delayed instances of time. In contrast to this prior art, the presently disclosed array achieves the desired phase delay matching by separately delaying the RF signals for driving different modulators of the array by means of separate TEM waveguides (into which the modulators are integrated) that have differing microwave propagation velocities or electrical lengths.

BRIEF DESCRIPTION OF THE INVENTION

The sensor head includes an EM-field concentrating structure such as a transverse electromagnetic (TEM) horn antenna, a metal-bounded dielectric-filled microwave or RF waveguide such as a dielectric-filled TEM waveguide, a piece (or multiple pieces) of electro-optic material embedded inside the microwave waveguide, and at least one integrated optoelectronic waveguide modulator formed in the electro-optic material. This sensor head is part of an RF-photonic or microwave photonic link that also includes a continuous wave (cw) laser light source, a photodetector, and multiple optical waveguides or optical fibers that interconnect the light source, the optoelectronic modulator, and the photodetector. In a preferred embodiment, an optical signal enters the integrated optic waveguide of the modulator and travels in a direction orthogonal to the direction the microwave EM field propagates through the microwave waveguide. The dielectric-filled TEM microwave wave guiding structure is capable of very broadband operation and, with its open sides free of metal, provides a convenient way of coupling optical fibers to the optoelectronic modulator embedded inside that microwave waveguide. The top and bottom metal surfaces of the TEM microwave waveguide serve as the driving electrodes for the optoelectronic modulator and provide a substantially uniform electric field for modulating the optoelectronic modulator across the length of that modulator.

The novel features of the disclosed apparatus this invention include:

1. The microwave receiver front-end assembly is based on using an efficient RF-photonic link to sense the incident microwave electromagnetic radiation without needing to absorb the microwave power. The sensor head allows the incident microwave radiation to pass through it or to be reflected from it, with preferably negligible absorption of that radiation. No electricity is carried between the sensor head and the rest of the receiver front end. By passively sensing the electric field components of the electromagnetic field passing through or reflected from the sensor head with an electro-optic material, and by converting the RF signals of that time-varying electric field into a time-varying RF modulation of the light carried in the RF-photonic link, this assembly self-limits the RF signal level that is supplied to the electronic components of the front end and enables it to not be damaged by high-power incident radiation. The output electrical signal of the RF-photonic link is limited by the input laser power of that link.

2. The dielectric-filled TEM horn and microwave waveguide of the sensor head serves as both an electric field concentrator and as the driving electrode of the optoelectronic modulator. This eliminates the need for more conventional printed circuit electrodes to be formed on the optoelectronic modulator, which because of their strong fringing fields are susceptible to damage when the front end is exposed to unwanted high power EM radiation. The TEM nature of the microwave waveguide supports a substantially uniform electric field for modulating the optoelectronic modulator. The metal-free open sides of the TEM microwave waveguide provide access for coupling fibers to the embedded optoelectronic modulator.

3. Although the microwave field is carried in a microwave waveguide, that microwave field propagates in a direction that is orthogonal to the direction in which the light propagates in the optoelectronic modulator, unlike a typical high-frequency optoelectronic modulator that has a traveling-wave electrode configuration. This results in the optoelectronic modulator behaving more as a bulk-electrode device. A novel feature of the present disclosure is that the RF field propagating in the microwave waveguide travels in a direction that is perpendicular to the direction in which the optical field propagates through the modulators (instead of being in the same direction as characteristic of prior art modulators). This perpendicular relationship is especially well suited to the TEM waveguide but TEM waveguides have not been used to supply the RF signals for prior optoelectronic modulators. Although the TEM RF waveguide actually provides a traveling EM wave, the RF drive for each optoelectronic modulator is in essence supplied by a bulk electrode (i.e., the RF drive signal for the entire length of that modulator arrives at the same instant in time). This dual use of an RF waveguide as both a traveling-wave and a bulk electrode is counterintuitive.

4. Multiple optoelectronic modulators can be incorporated into a single TEM microwave waveguide. The optical output of these modulators can be routed through optical waveguides such as optical fibers to the enclosure. The TEM waveguide can support a very large bandwidth of RF signals. Also, the width of the TEM waveguide can be varied, such as in the shape of a taper, while maintaining a large bandwidth. Different optoelectronic modulators that are sensitive to different ranges of signal frequencies can be placed at different locations within the same TEM waveguide. These different locations along the length of the waveguide correspond to different values of the TEM-waveguide width. In this configuration, the optoelectronic modulators are optically arranged in parallel and may even be part of different RF-photonic links.

5. The microwave sensor head (with either a single optoelectronic modulator or multiple modulators embedded in a single TEM microwave waveguide electric-field concentrating structure) can be a single element of an array, such as a microwave phased-array sensor. Such an array can provide improved sensitivity, phased array beam steering capabilities, or other useful characteristics. Possible configurations for the array include connecting the optical outputs of multiple sensor heads in series or in parallel.

BRIEF DESCRIPTION OF THE FIGURES

FIG. 11b is an illustration of the various frequency components of light at 3 different locations in the microwave photonic link of FIG. 11a.

DETAILED DESCRIPTION

Figure 1:
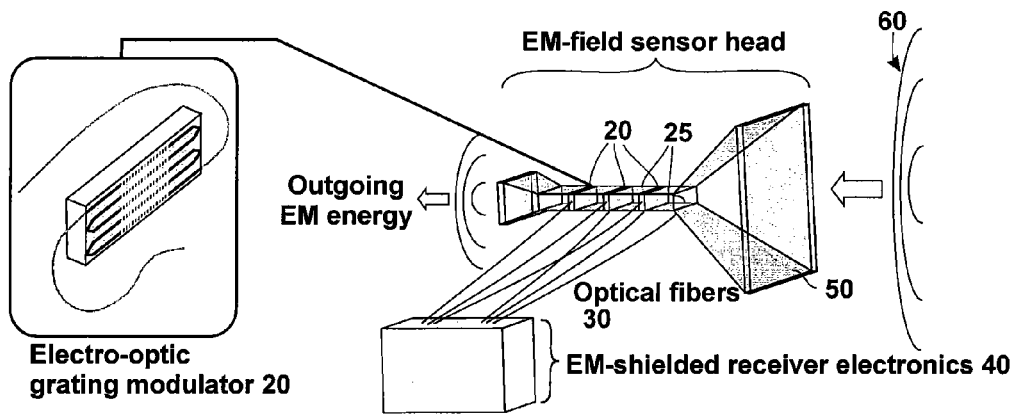
FIG. 1 depicts a microwave or RF receiver front-end that consists of an EM-field sensor head connected via electrically-isolating optical fibers to an EM-shielded enclosure that contains additional receiver electronic and optoelectronic components.

The technology described in this disclosure addresses the need to maintain high radio sensitivity, while at the same time, insuring tolerance to unwanted high-power, transient electromagnetic radiation. The disclosed microwave front-end assembly (or sensor head) 10 (see FIG. 1) includes a series of high-sensitivity electro-optic (EO) modulators 20. The modulators 20 passively probe the incoming electromagnetic (EM) field, by the field-dependent EO effect, without absorbing its associated EM energy. Optical fibers 30 of the microwave-photonic (MWP) links optically connect the sensor head 10 to a shielded enclosure 40 that protects the receiver electronics therein. As illustrated in FIG. 1, the sensor head 10 consists of a transverse electromagnetic (TEM) horn antenna 50 coupled to a dielectric-filled TEM microwave waveguide 25 containing at least one dielectric EO modulator 20. The design and quantity of the EO modulators 20 provide sufficient degrees of freedom to scale the receiver sensitivity, bandwidth, and high energy EM radiation tolerance in order to meet the specifications of a particular application.

Figure 2:
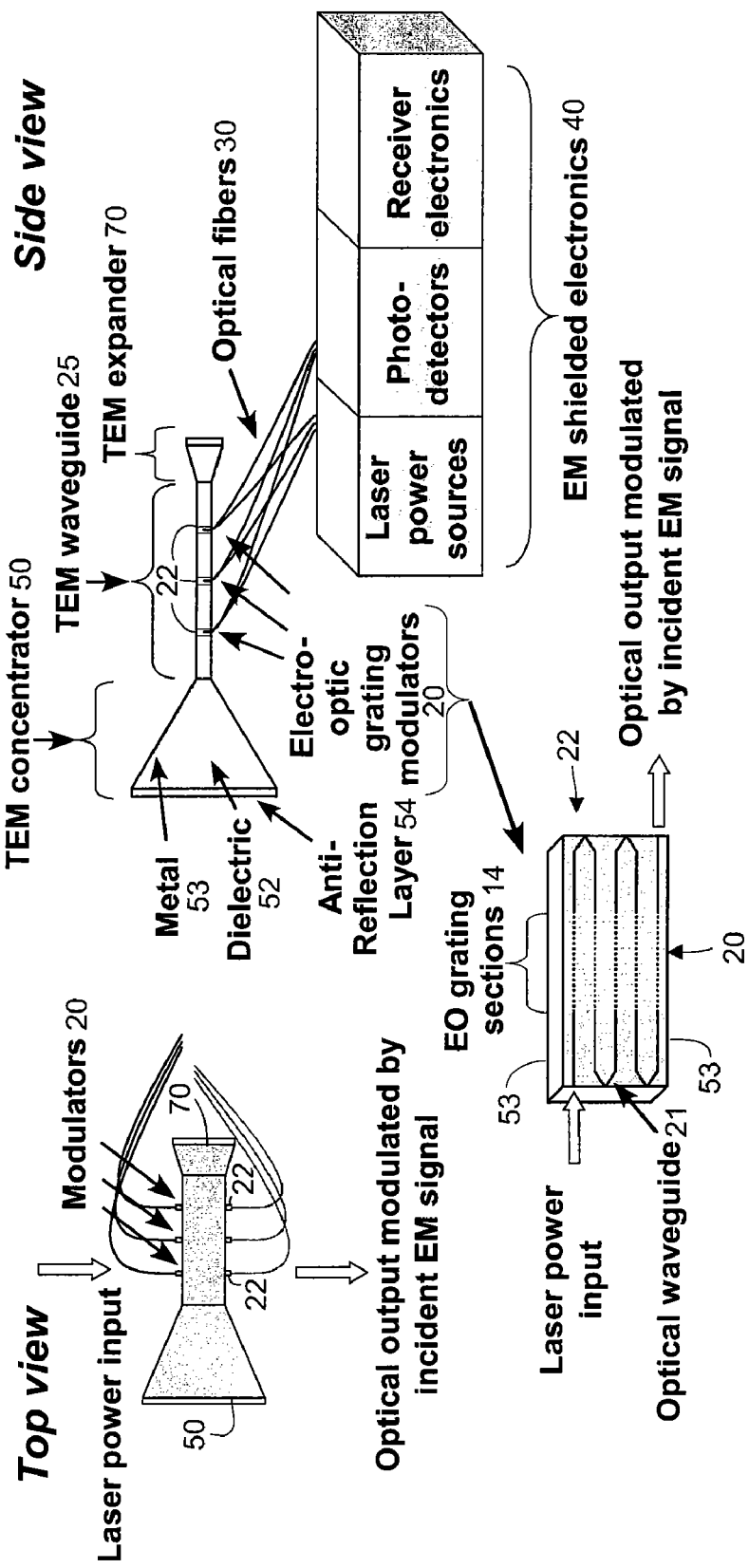
FIG. 2 shows details of the receiver front end, which is a microwave-photonic link. A part of the microwave-photonic link is the sensor head comprising an EM-field concentrating horn antenna, a TEM microwave waveguide, and at least one EO modulator. Another part of the microwave-photonic link includes lasers, photodetectors, and electronic amplifiers that are housed in the EM-shielded enclosure. The EO modulators are located within slices along the length of the TEM waveguide.

The microwave receiver front-end assembly 10 passively senses the power level of the incident radiation 60 without needing to actually absorb any appreciable amount of its energy. It is the absorption of microwave power in traditional receiver front ends that leads to the potential damage from arcing, heating and electro-migration. In contrast, the present front-end sensor head assembly 10 makes use of the electro-optic effect in an EO modulator 20, whose optical refractive index is dependent on the electric field experienced by the EO material of that modulator. The EO modulator 20 is part of a MWP link (see FIG. 11a) that supplies the signal to a shielded receiver, as also shown in FIG. 2. With the present assembly, only the modulator 20 of the MWP link is exposed to the incident EM environment 60. The laser and photodetector of the MWP link (FIG. 11a) as well as the other receiver components are housed in a shielded enclosure 40. That enclosure 40 preferably has only small-diameter (preferably less than 0.25 mm and typically approximately 0.125 mm) glass-filled openings through which the light to and from the modulators is fed by means of glass optical fibers 30, which allow only very small (and harmless) levels of the incident EM fields to penetrate the enclosure 40, from the outside to the inside. The link is shown by FIG. 11a.

The assembly 10 is based on three inter-related components: (i) a TEM horn antenna/concentrator 50 coupled to a TEM waveguide 25, (ii) an EO modulator 20, and (iii) a MWP link (FIG. 11a). Each component is preferably designed so that the sensor head 10 can withstand a specified level of unwanted power intensity, and so that the receiver can maintain required levels of sensitivity, bandwidth, and spur-free dynamic range (SFDR). The turn-on time for protecting against transient high-power incident radiation may be essentially instantaneous. The recovery time after that transient exposure to high-power incident radiation is ultimately limited by incidental thermal loading from the high energy EM radiation due to material losses, which is small. This change in temperature moves the operating point of the modulator. Thus, the recovery time typically is limited by the speed of a phase-lock loop that is employed to adjust the laser wavelength to the new optimal operating point.

Figure 11A:
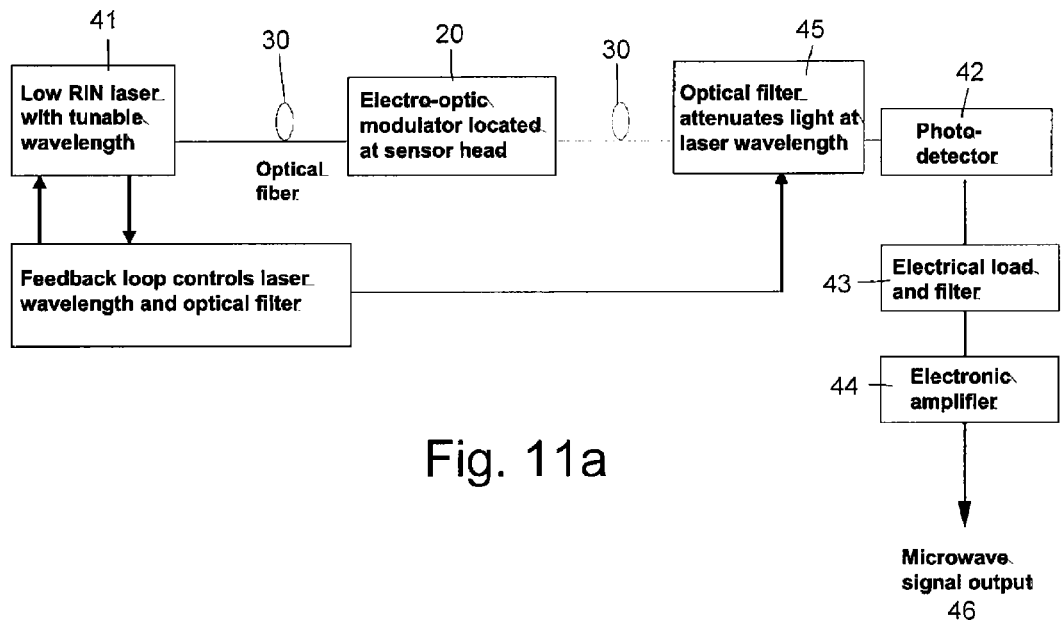
FIG. 11a is a block diagram of the microwave photonic link, which can be operated at high laser power, to increase its gain, but have its DC photo-current attenuated by optical filtering of the optical carrier to minimize non-thermal noise.
Figure 11B:
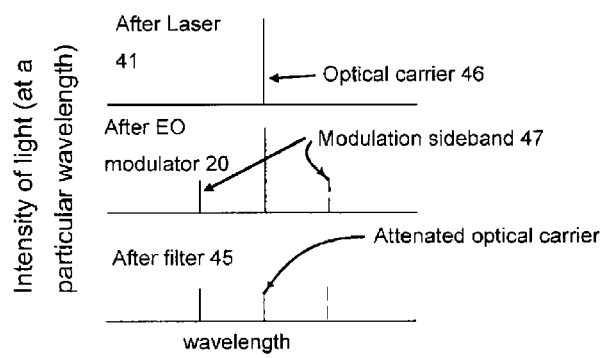

FIG. 11b is an illustration of the various frequency components of light at 3 different locations in the microwave photonic link of FIG. 11a.

TEM Horn Antenna and TEM Waveguide EM Field Concentrator

Figures 3A, 3B, 3C:
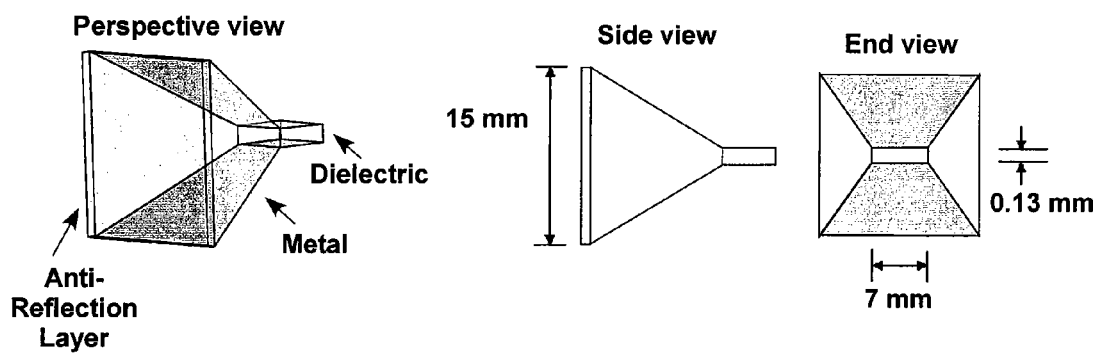
FIGS. 3a, 3b and 3c depict a perspective view, a side view and an end view, respectively, of the TEM horn concentrator which preferably concentrates the EM energy to a level just below the breakdown-field threshold of the materials in the front end EM-field sensor head.

The first component of the microwave receiver front-end assembly is the dielectric-filled TEM horn antenna 50, illustrated in greater detail by FIGS. 3a-3c. The role of the TEM horn antenna 50 is to concentrate, or to increase the intensity of, the electric field component of the incident EM radiation 60 while keeping the fields associated with unwanted high power EM radiation below the breakdown threshold for the materials present in the sensor head. Its design sets the intensity of the electric field seen by the modulator, thus affecting the sensitivity performance of the receiver front end. The horn antenna preferably has a square aperture of a size large enough to collect as much of the signal energy as possible, up to a size limited by the electrical breakdown that could occur in the TEM waveguide for a specified amount of unwanted incident power from a high-power source that would be collected and concentrated by the antenna. For phased array applications, the sensor head aperture would preferably be set to one-half of the wavelength corresponding to the microwave frequency of the signal to be sensed. Although other sizes also could be used, this size is preferred in order to make the front end compatible with the forming of arrays of multiple sensor heads 10, discussed later in this disclosure.

The outlet of the TEM horn antenna 50 mates with the inlet of the TEM waveguide 25 of the front-end sensor 10. The amount of E-field concentration achieved by the TEM horn antenna 50 is given by the ratio of the square root of the area of its output and the square root of the area of its inlet. The height of the TEM waveguide 25 is selected to supply a certain value of the E-field across the EO modulator, for an assumed level of incident signal radiation. The height of the TEM waveguide 25 also is selected to keep the value of the E-field below a damage threshold (such as the dielectric breakdown field of the material filling the TEM waveguide) for an assumed intensity of unwanted high-power incident radiation. By multi-furcating the horn and/or the TEM waveguide with multiple parallel TEM waveguiding structures, improvements in the receiver sensitivity can be achieved while maintaining a given damage threshold of the entire apparatus. This multi-furcated structure is discussed in greater detail in the related U.S. patent application Ser. No. 12/176,114, filed on the same date as this application and entitled "An RF Receiver Front-End Assembly" also identified above.

Figure 4A:
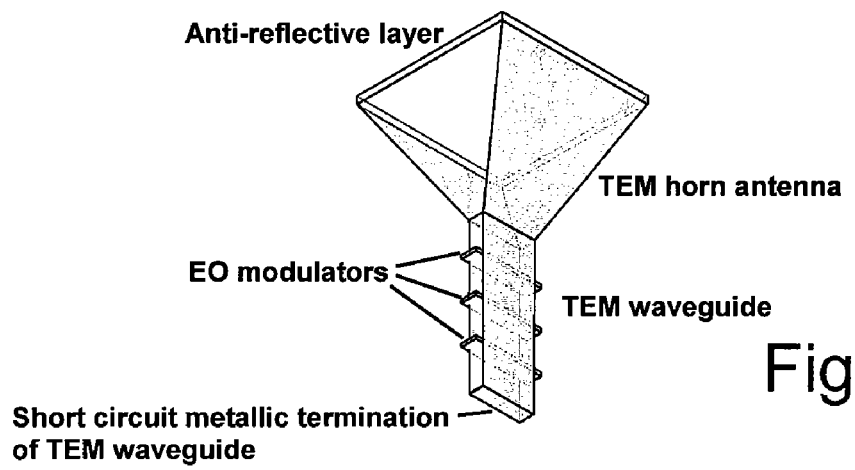
FIG. 4a depicts a TEM waveguide terminated by a short circuit, causing the incident EM energy to be reflected back outward.
Figure 4B:
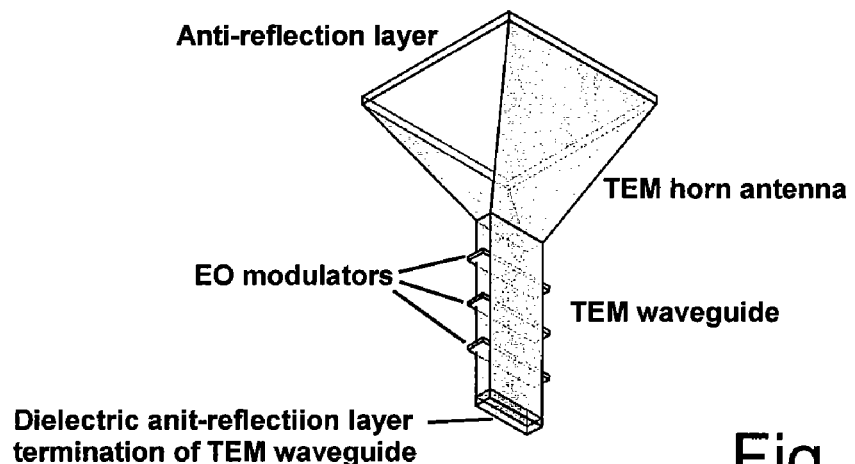
FIG. 4b depicts a TEM waveguide terminated by an anti-reflection layer, allowing incident energy to flow through the entire assembly.

In order to achieve minimal absorption of the incident signal, the TEM waveguide 25 may be terminated by another TEM horn antenna 70 as shown in FIGS. 1 and 2. Alternatively, a short circuit 70' or an antireflection layer 70", depicted in FIGS. 4a and 4b, could be used. In each of these cases, all of the incident EM fields are passively sensed by the incorporated RF-photonic link (FIG. 11a), but almost all of that incident microwave power is simply transmitted through or reflected from the front-end assembly 10. Only small amounts of the microwave energy are absorbed by the dielectric fill in the waveguide 25 due to its material absorption characteristics. Some heat is generated because of the currents induced in the metal of the TEM horn antenna 50 and TEM waveguide structure 25. An exemplary dielectric, electro-optic material is lithium niobate. An exemplary material for the dielectric fill is Eccostock® by Emerson and Cummings, which has a low dielectric-loss tangent at microwave frequencies and also has approximately the same dielectric constant value as that of lithium niobate and other typical optoelectronic materials. See Emerson and Cuming Microwave Products, Eccostock® HiK500F data sheet, (available at www.eccorsorb.com), rev. May 11, 2007.

A dielectric matching layer or anti-reflection layer 54, or layers, may be introduced at the interfaces between air and the dielectric filling material inside the waveguide 25 as shown in FIG. 2. This matching layer 54, or layers, may be located at the inlet of the TEM concentrator 50 (which may be filled with dielectric material), at the outlet of the TEM expander 70 (which also may be filled with dielectric material), and at the junction between the TEM concentrator or TEM expander and the TEM waveguide 25 (e.g., for a concentrator or expander that is filled with air). Other matching layer 54, or layers, also may be introduced at the interfaces between the dielectric filling material and the electro-optic material in the case where there is a significant difference between their respective dielectric constants.

The following discussion provides an example of a dielectric-filled TEM horn antenna 50 design. For this example, we assume that a 100 MW/m$^2$ EM field 60 is incident on the concentrator 50 and that both the concentrator 50 and the TEM waveguide 25 are filled either by lithium niobate or by a dielectric material having the same dielectric constant as lithium niobate. For a 15 mm square aperture, assume that a power level of 22 kW is coupled into the horn antenna 50. If all of the power is delivered to the TEM waveguide 25 (whose width is determined by the constraints of the EO modulators 20 in it), that waveguide 25 can have a cross-sectional area of 7 mm×0.13 mm and still keep the resultant E-field at least four times lower than the breakdown field level for lithium niobate (with a margin of 6 dB). The concentration ratio for this example is approximately 240.

The dielectric-filled TEM horn antenna 50 and waveguide 25 are preferably covered by metal 53 on two opposite sides and are open on the two other opposite sides. Thin slices 22 of EO material are integrated into the TEM waveguide 25. Each slice 22 contains one or more E-field controlled EO modulators 20. Laser light passes through an optical waveguide structure 21 formed in each slice 22. The non-metal sides of the TEM microwave waveguide 25 provide convenient access for routing optical fibers to and from the optical waveguide modulators. Each slice 22 in this example comprises a 20-500 μm thick piece of the EO material (such as lithium niobate) that may be covered on one side by a 2-3 μm thick film of silicon dioxide (or another material that has a low optical refractive index). The film of silicon dioxide is too thin to be shown given the scale of this drawing. The regions between slices 22 may be filled with the same low-loss microwave dielectric material 52 that fills the TEM horn antenna 50, which is preferably chosen to have the same dielectric constant as the EO material of the modulator 20 material. The matching of the dielectric constant is desired so that there is little reflection at the interface(s) between the fill material of the microwave waveguide 25 and the EO material of the modulator 20.

Figure 5:
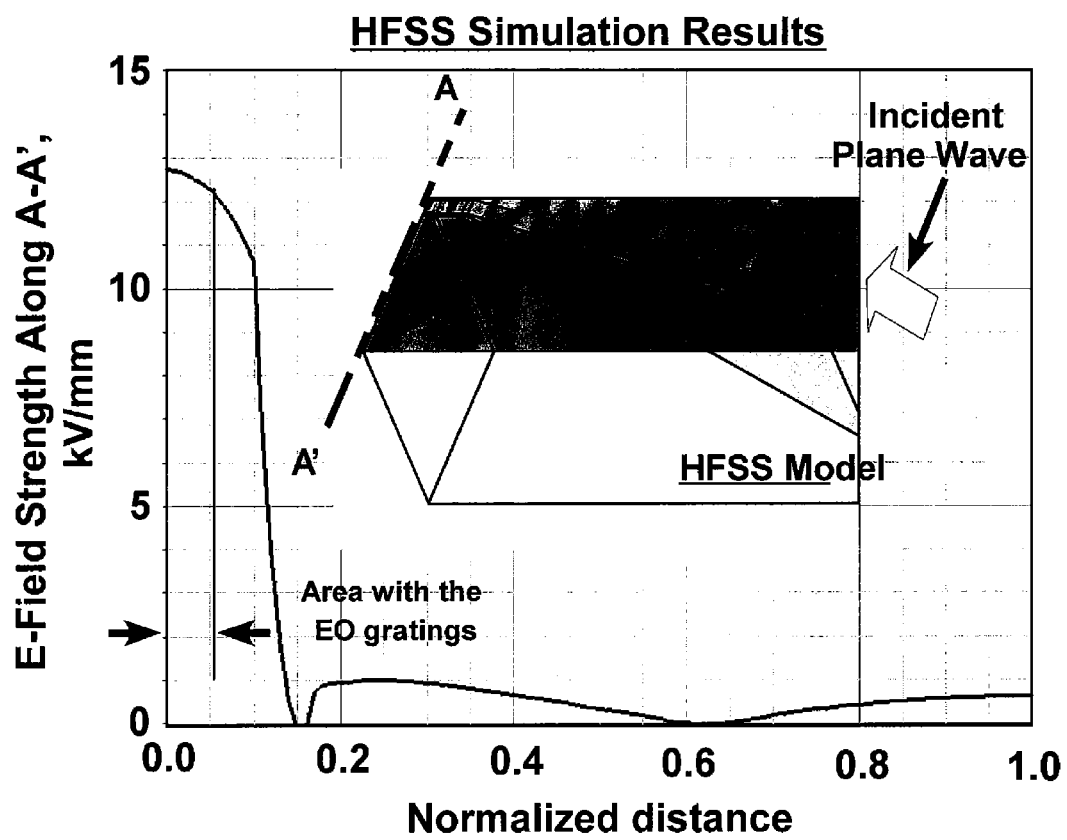
FIG. 5 is a graph which demonstrates that with a TEM waveguide, the E-field distribution across the central region of the EO modulator is quite uniform.

An important feature of the dielectric-filled TEM waveguide 25 is that the E-field strength of the microwave field propagating in that waveguide 25 is fairly uniform over a large central portion of its cross-section, as shown in FIG. 5. One embodiment of EO modulator 20 is an EO grating modulator (illustrated in FIGS. 1 and 2). The grating sections 14 of this modulator are located in this central portion, so that they experience a spatially uniform but time-varying change due to the time-varying E-field. It is also worth noting that although our EM field concentrating antenna and microwave waveguide do include some metal, unlike a prior art receiver apparatus that likewise is tolerant of unwanted high-power radiation (see the article by Hsu et al. noted above), the sensor head of this present disclosure still achieves high damage thresholds because of our choice of a TEM structure that has minimal fringing fields. The low level of these fringing fields is also depicted in FIG. 5.

Both the TEM horn antenna and the TEM waveguide can support a wide range of microwave frequencies. The HFSS simulation results shown in FIG. 6b indicate that the TEM waveguide 25 with a pair of impedance matching or anti-reflection layers 54 can have a bandwidth of more than one octave. Also, this large bandwidth is maintained even when the waveguide width is tapered, to match various sizes of the EO modulators. The bandwidth of the structure is limited by the anti-reflection layer. The double-layer anti-reflection (AR) structure of FIG. 6a has a bandwidth of 8 to 18 GHz. If both ends of the entire TEM horn antenna and waveguide structure are impedance matched to air, then the incident radiation will just pass through the proposed EM-field sensing front end like a fluid would flow through a pipe.

The main damage mechanism from incident high power EM radiation on the proposed front end is breakdown of the dielectric materials due to excessive field strength.

Therefore, the entire structure is designed to keep the E-field intensities within the TEM waveguide below the breakdown strengths of its constituent materials.

A significant advantage of the disclosed front end is that most of the momentary EM radiation 60 incident on the sensor head 10 passes right through it, although the E-field amplitude is sensed as a result of its perturbation of the refractive index of the modulator's EO material. Nevertheless, a small percentage of that incident radiation 60 is absorbed in the various dielectric materials of the TEM horn antenna 50 and waveguide 25 because of the non-zero, albeit small, loss tangent of those materials. Also, another small percentage is absorbed in the thick metal portions 53 of the TEM horn antenna 50 and TEM waveguide 25. This absorption is estimated to be less than 10 Joules for a 1 ms duration 100 MW/m$^2$ incident pulse.

Figures 7A, 7B:
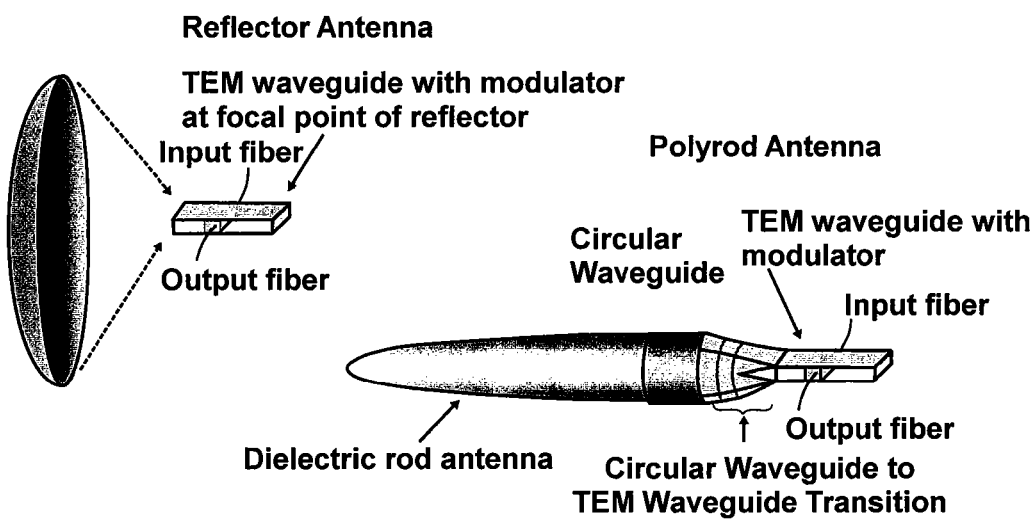
FIGS. 7a and 7b shows two other embodiments of the sensor head, with one embodiment including a dish antenna and the other embodiment including a dielectric rod antenna, both antennas concentrating the EM field and coupling the concentrated EM field into the TEM waveguide.

It is important, for some embodiments of the optoelectronic modulator, that the transverse field established across the optoelectronic modulator 20 be as uniform as possible. A TEM waveguide is especially suitable to this end. However, other microwave-waveguide structures also could be used such as a microstrip transmission line and even a dielectric slab. The antenna itself need not be a dielectric-filled TEM horn 50, although the dielectric-filled TEM horn is preferred in some cases, such as when the sensor head is an element of a phased array. Besides the dielectric-filled TEM horn, other antennas could be used, such as air-filled TEM horn antennas, standard non-TEM horn antennas, dish antennas, dielectric rod antennas, etc., as long as an appropriate transition to the disclosed TEM waveguide is provided. Two examples of sensor heads containing other types of antennas are shown in FIGS. 7a and 7b.

Compact, Electro-Optic (EO) Modulator

A second primary component of the microwave receiver front-end assembly is the EO modulator 20 that is embedded in a TEM microwave waveguide 25. A TEM microwave waveguide 25 is essentially a slab or slice of dielectric material with two opposing faces that are covered by metal film 53. A portion of these two metal faces 53 of the TEM waveguide comprise the metal electrodes of the EO modulator 20. An advantage of this construction of an EO modulator is that while it has integrated optic waveguides, it has no printed circuit electrodes. The TEM waveguide 25 has weaker fringing fields than does a microwave transmission line with printed-circuit electrodes. Thus, the TEM waveguide can establish a larger electric field between the two pieces of metal that make up the top and bottom faces of the TEM waveguide before being damaged by dielectric breakdown of its fill material. The breakdown typically occurs at the edges and corners of prior art printed-circuit electrodes because of strong or intense fringing fields at those locations. Another advantage is that the electric field distribution established in a TEM waveguide is fairly uniform. For a given input microwave signal, the electric field intensity maintained between the top and bottom faces of the TEM waveguide 25 depends on the height of the TEM waveguide (the spacing between its top and bottom electrodes) and on the dielectric constant of the fill material (which could well be lithium niobate). The height of the TEM waveguide 25 is constrained to be sufficiently large such that the high-power incident EM radiation generates an electric field across those top and bottom electrodes 53 that is below the dielectric strength of the fill material.

The depth of modulation of the optical signal in an integrated EO waveguide modulator 20 will increase as the incident electric field strength increases. However, since the TEM waveguide 25 is relatively high (or thick), to avoid having a high-power incident microwave field cause the dielectric material to break down, the electric field intensity produced at this modulator for a desired microwave signal incident on the front-end assembly is weak. The width of the TEM waveguide 25 is constrained, by the desire to have the front-end assembly 10 be sufficiently small that it can be an element in a microwave phased array, to be no larger than one-half period of the desired incoming microwave signal to be sensed. For an X-band microwave signal, the width of the TEM waveguide 25 is approximately at most 15 mm. This width is smaller than the length of a typical high-sensitivity electro-optic modulator. In order to achieve high modulator sensitivity for a given modulator length, the modulator 20 in some embodiments disclosed herein comprises an EO grating modulator or an EO Fabry Perot resonator modulator.

Figure 8A:
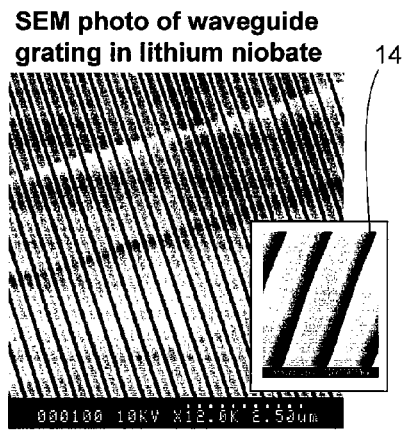
FIG. 8a shows a Bragg grating modulator which can be formed by etching a surface corrugation into a titanium-diffused lithium niobate waveguide.
Figure 8B:
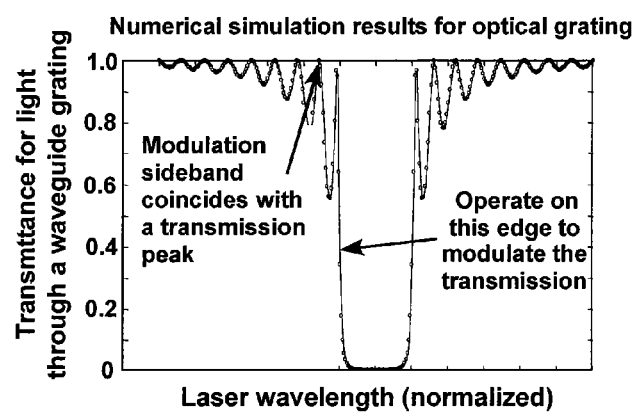
FIG. 8b is a graph of the transmission spectrum of a grating. The transmission of the grating modulator is varied by the E-field incident on the EO material, with high sensitivity.
Figure 8C:
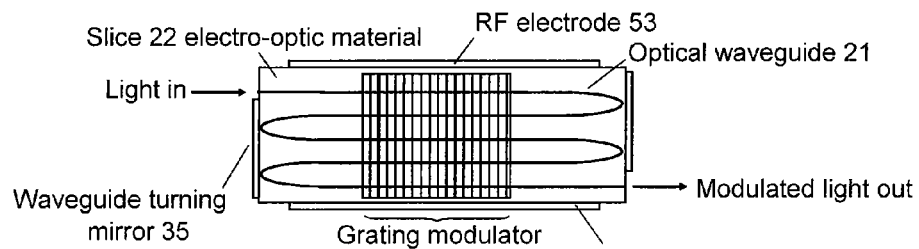
FIG. 8c illustrates a multi-section Bragg grating modulator that can be formed in a slice of the TEM waveguide.

In some embodiments, the electrooptic modulator is an EO grating modulator. The EO grating 14 of this modulator can be formed, for example, by etching a periodic surface corrugation into an optical waveguide formed in the EO material, such as lithium niobate, as shown in FIG. 8a. The corrugation produces a periodic change in the effective index of the guided light. In general, the period of that corrugation is equal to one-half of the effective optical wavelength in the EO material (the free-space wavelength divided by the material refractive index). One way to realize the modulator 20 is described, as an example. First, fabricate a titanium-diffused optical waveguide in the lithium niobate substrate. Then, use laser holography to expose a grating pattern onto a photoresist film deposited on the substrate. The grating pattern is then transferred to the surface of the substrate by a series of dry etching steps. In general, the EO grating modulator substrate will extend up to or just inside the width of the TEM microwave waveguide. Light is coupled into and out of the EO grating modulator via the two exposed sides of the TEM waveguide that are not covered by metal. To achieve higher modulation sensitivity some embodiments of the modulator comprise a zig-zag waveguide pattern and a cascade of multiple gratings (as illustrated in FIGS. 1, 2 and 8c). This cascade of grating sections 14 and the individual grating modulators 20 themselves are described in greater detail in related U.S. patent application Ser. No. 12/141,825 which is identified above.

The optical-grating EO modulator 20 acts as a distributed Bragg reflector whose transmission and reflection can be changed as a result of changing the E-field applied across the EO material of that modulator. This Bragg grating modulator can achieve high modulation sensitivity (i.e., the change in the amount of light transmitted through the modulator for a unit change in the incident E-field) and has a large instantaneous bandwidth (IBW). The grating is a transmission-notch filter that reflects light over a range of wavelengths. Light is supplied to the modulator from a laser whose wavelength coincides with the steep sidewall of the wavelength-transmission notch of the grating (see FIG. 8b). A small change in the optical refractive index, resulting from a change in the E-field amplitude, thereby shifts the transmission curve of the grating and modulates the laser light (whose wavelength is fixed).

Three constraints are balanced when choosing the operating wavelength for the MWP link (FIG. 11a) and in designing the length of the grating structure 14 and the depth of the corrugations. First, when the bandwidth of the desired input microwave signal is smaller than one octave, the RF photonic link (FIG. 11a) preferably is operated at an optical wavelength for which the third derivative of the filter characteristic is zero. This choice of operating point minimizes the intermodulation distortion for very large signals. Second, we select the grating length and corrugation depth of the grating to yield a group delay (at the chosen wavelength) that is smaller than one-half the period of the microwave signal (e.g., 50 psec for a 10 GHz microwave carrier). Third, we also select the grating length and corrugation depth to place one of the modulation sidebands (e.g., which would be 0.8 angstroms away from the laser wavelength for 10 GHz modulation) at a transmission peak in the filter characteristic. The other modulation sideband would be located in the transmission notch. This means that the modulator produces single sideband (SSB) modulation. More of these details on the design of EO grating modulators can be found in (i) related U.S. patent application Ser. No. 12/141,825 entitled "Optoelectronic modulator and electric-field sensor with multiple optical-waveguide gratings" and (ii) related U.S. patent application Ser. No. 12/141,834, entitled "Enhanced Linearity RF Photonic Link", both of which applications are also identified above.

In one preferred embodiment, the EM field travels within the TEM waveguide in a direction perpendicular to the plane of the optical waveguide 21 and the grating 14 of the modulator 20. This is referred to as the "microwave-phase-matched" design. For example, if the modulator comprised a zig-zag cascade of multiple gratings formed in lithium niobate EO material, this configuration would require x-cut pieces of lithium niobate. Those pieces of lithium niobate are located in the TEM waveguide 25 as cross-sectional slices 22 containing the modulator 20 through that TEM waveguide 25, as illustrated in FIGS. 1 and 2. The microwave EM field propagating through the TEM waveguide 25 produces a time-varying E-field at the slice 22 containing the modulator 20. The intensity of this E-field oscillates (in time) with a period that is the inverse of the microwave frequency. The light (the optical EM field) travels through the modulator 20 in a direction that is perpendicular to the direction of travel for the microwave EM field propagating through the TEM waveguide 25. Thus, although the microwave field is a traveling wave, the modulator has bulk electrodes that apply an E-field that does not travel along the length of the optical-waveguide 21 in the modulator 20. Instead, for a TEM waveguide, the entire length of a grating section 14 experiences the same intensity of E-field. The grating is preferably designed to achieve maximum sensitivity by keeping the group delay of the light that travels from one end of a grating section to the other end smaller than one-half period of the microwave or RF modulating signal. If the optical signal, the light, were to remain in the grating for a time longer than one-half of an RF period, it would begin to experience an electric field having the opposite sign. This would degrade the depth of modulation. Thus, for a modulator having a single grating section, the light propagating in that modulator experiences at most a half period of the modulating RF signal. Related U.S. patent application Ser. No. 12/141,825, entitled "Optoelectronic modulator and electric-field sensor with multiple optical-waveguide gratings" describes another modulator that comprises a cascade of multiple, appropriately spaced gratings interconnected by segments of optical waveguides. For this other modulator the length of the interconnecting waveguides is designed such that the light reaches successive gratings at a time interval equal to the period of the modulating RF signal. With the multiple gratings, the light propagating in this other modulator experiences multiple periods of the modulating RF signal so the modulation depth can be enhanced. For a modulating RF signal of less than 50% bandwidth, the intensity of the light transmitted through this other modulator can be further modulated when that light passes through each successive grating of the cascade.

Figure 9:
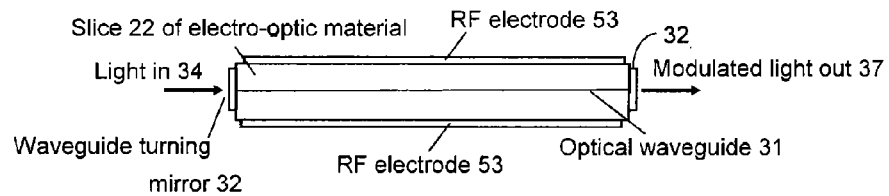
FIG. 9 illustrates a Fabry Perot cavity modulator that can be formed in a slice of the TEM waveguide.

Another embodiment of the EO modulator 20 is an electrooptic Fabry-Perot (FP) cavity modulator that is built into the TEM waveguide 25. The physical construction of this modulator is an optical waveguide formed in an EO material such as lithium niobate. The optical waveguide has partially reflecting mirrors 32 formed at the ends of that optical waveguide 31, as illustrated in FIG. 9. These waveguide ends could comprise part of the sides of the TEM waveguide 25. Dielectric multi-layer optical reflectors, known in the art, can be used to achieve some desired reflectivity for the FP cavity. The transmittance spectrum of the FP cavity has a transmittance peak that is centered at some wavelength. The FP cavity modulator is operated by supplying laser light 34 whose wavelength lies on one edge of the transmittance peak. Like the grating modulator, the transmittance peak of the FP cavity modulator is shifted (in wavelength) when the intensity of the E-field produced across the two electrodes 53 of the modulator changes. This shift in the transmittance peak modulates the intensity of the light transmitted through the FP cavity, for that wavelength of laser light. The length of the cavity and the reflectivity of the dielectric reflectors 32 determine the sharpness and bandwidth of the transmittance peak, and also the sensitivity of the modulator. The length of that FP cavity also determines the specific range of microwave frequencies that would be matched to this modulator. Preferably, the FP cavity length is selected so that the optical-frequency spacing between cavity resonance peaks is equal to the frequency of the microwave modulation signal. A lithium niobate FP cavity modulator would be constructed from a piece of z-cut or x-cut lithium niobate material.

Figure 6A:
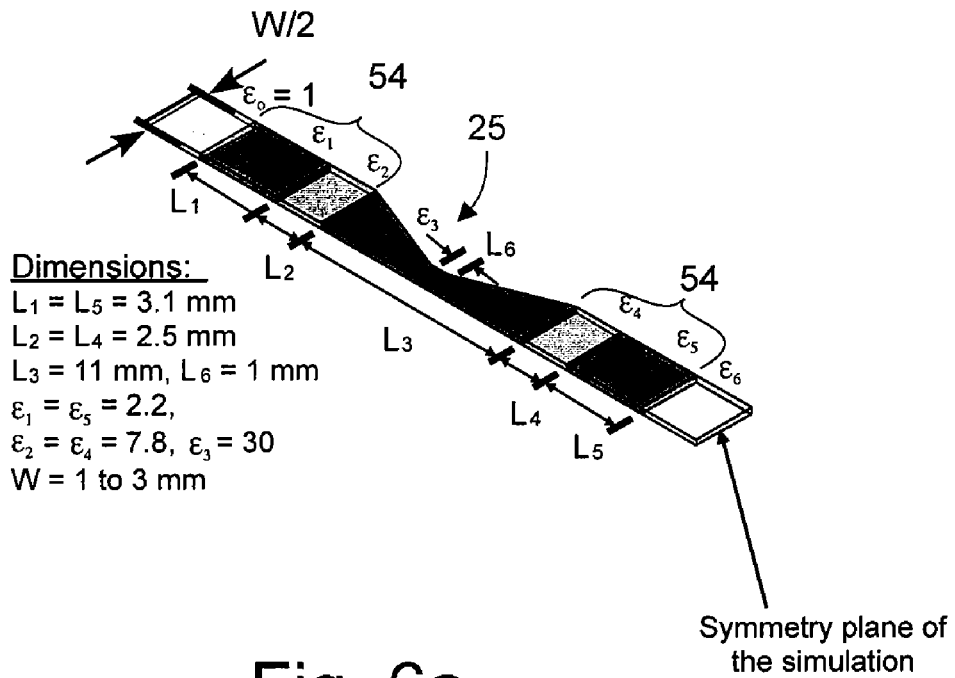
FIG. 6a shows a tapered TEM waveguide while FIG. 6b demonstrates that the tapered TEM waveguide has a large bandwidth, with low reflection. The bandwidth is limited by the design of its anti-reflection (impedance matching) layer or structure.
Figure 6B:
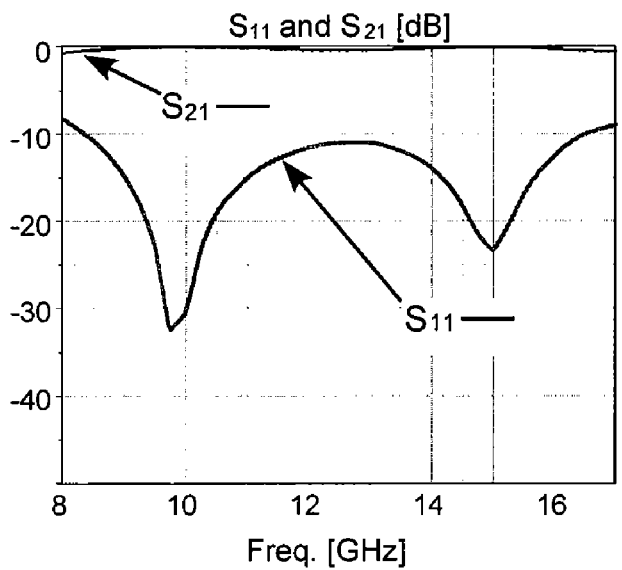

This resonator-based modulator has narrow bandwidth. However, one can construct a multi-channel front end that has a wide total bandwidth by embedding multiple resonator modulators in the wideband TEM waveguide 25. Each resonator modulator can have a different length that is matched to a different frequency component of the received microwave signal. For such a multi-channel front end, the width of the TEM waveguide 25 may vary or taper such that the width is different for different positions along its length. An example of a tapered TEM waveguide 25 is illustrated in FIG. 6a.

Figure 10A:
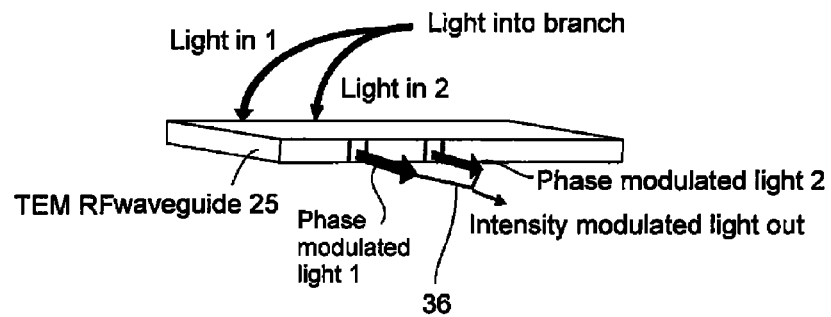
FIG. 10a illustrates a Mach-Zehnder intensity modulator comprising two arms each of which includes a phase modulator, with those phase modulators formed in two different slices of the TEM waveguide.
Figure 10B:
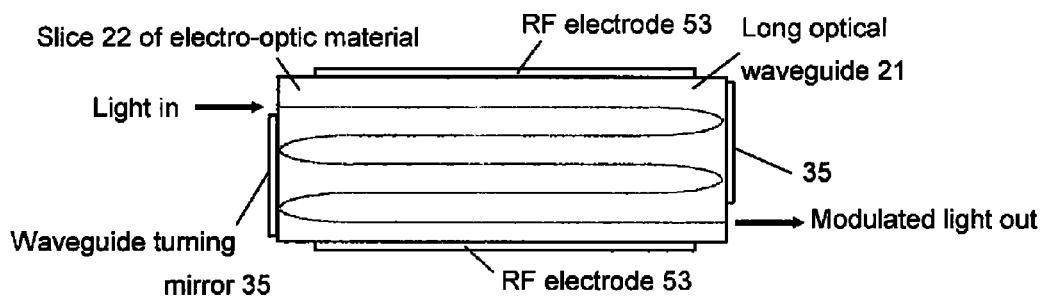
FIG. 10b illustrates a phase modulator that can be formed in a slice of the TEM waveguide.

Yet another embodiment of the EO modulator 20 is based on an electro-optic phase modulator built into the TEM waveguide 25. This phase modulator is part of an external Mach-Zehnder interferometer and is located in one arm of the interferometer, as illustrated in FIG. 10a. The phase modulator preferably comprises a zig-zag optical waveguide 21 constructed from EO material, with the waveguide making multiple passes through the slice 22 of EO material and being reflected from turning mirrors 35 formed on the two sides of the TEM waveguide 25 that are not covered by the metal electrodes 53. The rest of the optical interferometer could be constructed from optical fiber, including optical-fiber 1×2 couplers 36. One or both arms of the interferometer could consist of the phase modulators. If both arms of the interferometer consist of phase modulators, those modulators are preferably placed in the TEM waveguide at positions that are selected to have the time-varying E-fields across those two modulators be 180-degrees out of phase. In that case, we obtain a "push-pull" operation that enhances the modulator sensitivity to small changes in the E-field.

RF-Photonic Link with High Sensitivity and High Dynamic Range

The microwave receiver front end assembly is part of an external-modulation microwave-photonic (MWP) link (or RF-photonic link). This MWP link of FIG. 11a comprises a grating modulator 20, a tunable wavelength laser 41, a photodetector 42, and a post-detector amplifier 44. The electrical output of the photodetector 42 (its output current or the voltage across a load 43 connected to the photodetector output) is the microwave output signal of the front end assembly 10. The post-detector amplifier 44 can be used to increase the level of that output signal to match some specified level required by subsequent stages of the microwave receiver system. The laser 41, photodetector 42 and post-detector amplifier 44 preferably are located inside of the EM-shielded housing 40, as illustrated in FIGS. 1 and 2. The laser 41 and photodetector 42 are optically coupled to the modulator 20 embedded in the TEM waveguide 25 by means of optical fibers 30.

The sensitivity of the MWP link of FIG. 11a is determined both by the intensity of the microwave-modulated light and by the noise generated in the receiver front end. The signal strength at the output 46 of the MWP link depends on the laser intensity and on the sensitivity of the modulator(s) 20. The sensitivity of the modulator(s) 20 can be obtained from the first derivative of a modulator transfer function that describes the transmission versus the refractive index. The refractive index is changed by the modulating microwave E-field, with that change also depending on the EO efficiency of the EO material and on the overlap of the optical and electrical fields in the modulator. For the grating modulators formed in a TEM waveguide 25, that overlap is 100%.

We denote the normalized transmission (i.e., $T_{max}=1$) of the modulator as $T(\lambda)$ and define an equivalent—$V_\pi(V_{\pi eq})$ for that modulator. FIG. 8b shows an exemplary plot of $T(\lambda)$ that was calculated for a Bragg grating modulator. The Bragg reflection stopband (the transmittance notch) of the modulator corresponds to range of wavelengths wherein $T(\lambda)$ approaches zero. As discussed above, the incoming RF signal is impressed on the optical carrier via electric-field modulation of the transmission $T(\lambda)$ about a set wavelength (of the laser source). The modulation voltage is equal to the value of the electric field at the TEM waveguide slice 22 containing that modulator 20 multiplied by the value of the separation between the top and bottom electrodes 53 of the TEM waveguide at that slice 22. The efficiency of this voltage (V) modulation of the transmission can be described, in turn, as:

$$\frac{\partial T}{\partial V} = \frac{\partial T}{\partial \lambda}\frac{\partial \lambda_B}{\partial V} = 2\Lambda_B \frac{\partial T}{\partial \lambda}\frac{\partial n}{\partial \Lambda} \qquad \text{(eqn. 1)}$$

where $\Lambda_B$ is the Bragg grating period, and n is the modulator's refractive index (taken to be ~2.18 for the exemplary calculations below). In particular, the parameter $\partial n/\partial \Lambda$ in Eqn. 1 is related to the modulator's electrode design, which must be accomplished in accordance with the requirement to withstand unwanted high power EM radiation. For example, the spacing between the electrodes 53 must be sufficiently large that the E-field in TEM waveguide 25 obtained for some maximum value of the incident radiation 60 still is below the dielectric breakdown strength of the materials in that TEM waveguide. An equivalent $V_\pi(V_{\pi eq})$ for a modulator is defined as $(\pi/2)/(\partial T/\partial V)$. Other expressions, similar to Eqn. 1, for the change in the transmission of light through the modulator for a given modulation voltage, can be derived for the Fabry Perot cavity modulator and for the Mach-Zehnder interferometric modulator using principles known to one practicing the art of electro-optic modulators.

The sensitivity of the MWP link is basically its equivalent input noise (EIN), which is the sum of the link's noise figure (NF) and the thermal noise floor (=−174 dBm/Hz). For an exemplary intensity-modulated direct detection (IM/DD) link biased at half of the modulator's transmission-maximum $P_{max}$, the intrinsic link NF is given by:

$$NF = \left(\frac{V_{req}}{\pi}\right)^2 \left(\frac{1}{R_M kT}\right)\left(RIN + \frac{2e}{I_{DC}}\right) + 1 \qquad \text{(eqn. 2)}$$

Figure 12:
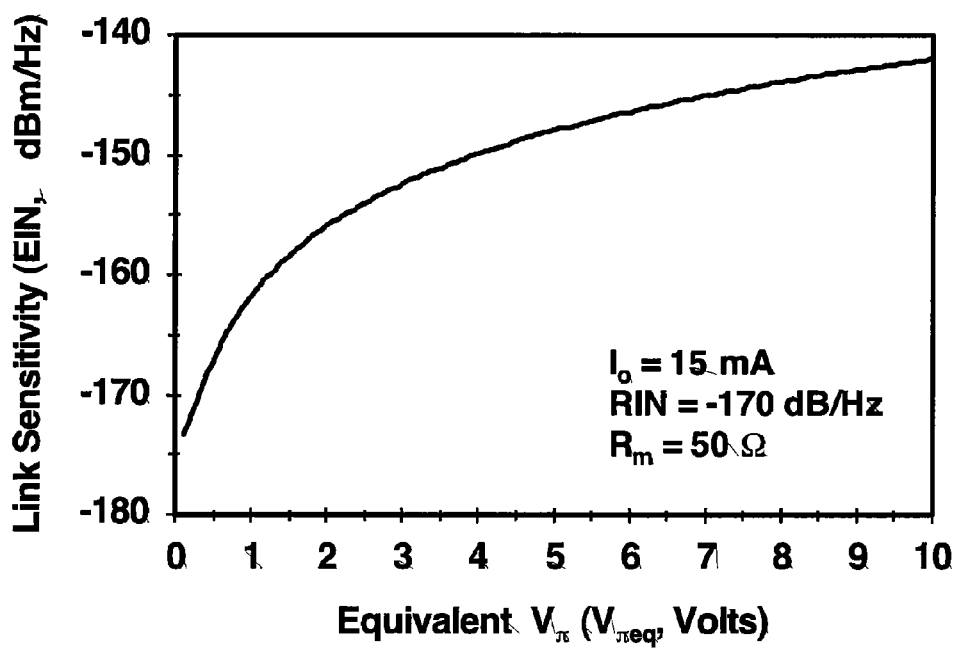
FIG. 12 is a plot of the sensitivity of an RF-photonic link vs. the equivalent—$V_\pi(V_{\pi eq})$ of its Bragg grating modulator.

In Eqn. 2, RIN denotes the relative intensity noise of the CW laser source, $I_{DC}$ the DC photo current generated at the photo detector, and $R_M$ the load resistance of the Bragg grating modulator. This equation ignores the contribution of the photodetector thermal noise, which is assumed to be much smaller than the photodetector shot noise. Using Equations 1 and 2, we plot in FIG. 12 the link-sensitivity that one can attain for a range of $V_{\pi eq}$ values. For example, in an EO grating modulator with a grating (grating-period $\Lambda_B$= 0.356 μm) of length ~1.8 mm, the $V_{\pi eq}$ is 6.9 V. For a $V_{\pi eq}$ of 1.2V, one can achieve a link sensitivity of better than −160 dBm/Hz.

The sensitivity of the entire front end depends not only on the signal power but also on the overall noise power. The noise in an external-modulation MWP link arises primarily from the intensity noise of the laser, the shot noise in the photodetection process, the thermal noise of the electrical load of the photodetector and any additional noise from the electronic amplifier downstream of the photodetector. To achieve a low noise figure, the effective gain of the MWP link must be high enough to overcome the noise associated with the photodetection. This increase in the signal is accomplished by increasing the laser power, to effectively increase the modulated signal power. At a sufficiently high laser power, the link noise can become limited by the photodetector shot noise instead of thermal noise (from the resistive load of the photodetector). In a preferred embodiment, the photodetected power at the laser carrier wavelength (which contributes only a DC photo-current plus noise) is attenuated by placing an optical filter 45 between the modulator 20 and the photodetector 42 (see FIG. 11a). The optical filter 45 is designed to attenuate the laser-wavelength or optical carrier component enough that the contribution from the photodetector shot noise is comparable to the thermal noise of the photodetector load resistance. Note, incidentally, that since the grating modulator operates as a single-sideband modulation device, more laser light must be supplied to that modulator, and attenuated by this optical filter 45, in order to obtain the desired signal level at the photodetector output. When the laser power is increased even further, the noise of the MWP link becomes limited by the relative intensity noise (RIN) of the laser light. In contrast to the grating modulator, both the Fabry Perot cavity modulator and the Mach Zender interferometric modulator, which contains at least one phase modulator, typically provide double-sideband modulation (as illustrated in FIG. 11b). A preferred embodiment utilizes a laser-diode pumped optical fiber laser that has very RIN and whose output wavelength is tunable. Other wavelength-tunable lasers, such as semiconductor distributed feedback lasers, also could be used and have only slightly higher RIN.

The NF of the intrinsic photonic link is inversely proportional to its gain G, which is given by:

$$G = I_o^2 \left(\frac{\partial \lambda_B}{\partial V}\right)^2 \left(\frac{\partial T/\partial \lambda}{T(\lambda)}\right)^2 R_L R_M \quad \text{(eqn. 3)}$$

Eq. 3 shows that aside from the typical dependence of G on $I_o^2$ where $I_o$ is the DC component of the photo-current that would be detected at the output of the modulator 20, before the modulated light passes through the optical filter 45, the modulated light comprises a component at the optical carrier 46 (the wavelength of the supplied laser light) and another component at the modulation sideband 47. This equation describes the modulated light, the sideband component, as a percentage of the un-modulated light, the optical-carrier component. The optical filter selectively attenuates the optical-carrier component 46 without affecting the modulation sideband 47. Thus, the effective modulation depth of the light delivered to the photodetector is increased. The DC photo-current of the photodetector 42 is reduced and the photodetector shot noise is reduced. The link gain G is also proportional to the square of $\partial T/\partial \lambda$ and $\partial \lambda_B/\partial V$. As mentioned earlier, the latter is determined by the height of the TEM waveguide and is set to meet the requirement for tolerance to unwanted high power EM radiation. The former is determined by the length of the Bragg grating and by the depth of the etched grating corrugations in an EO grating modulator. In an EO Fabry Perot cavity modulator, the former is determined by the reflectivity of the cavity mirrors. These parameters are set to meet the requirement for a maximum modulation frequency.

$$R = \frac{\frac{\partial T}{\partial \lambda}}{\left(\frac{\partial^3 T}{\partial \lambda^3}\right)^{1/3}} \quad \text{(eqn. 4)}$$

$$SFDR = 4^{2/3} \left[\frac{\frac{\partial T}{\partial \lambda}}{\left[\left(\frac{\partial^3 T}{\partial \lambda^3}\right)^{1/3}\right]}\right]^2 \left(\frac{P_{max}}{P_o}\right)^{4/3} \left[\frac{I_o}{2e + I_{DC}RIN + kT/(I_{DC}R_L)}\right] \quad \text{(eqn. 5)}$$

Scaling to Multiple Frequency Bands

Because of its large bandwidth, the TEM microwave waveguiding structure can be filled with several sets of EO modulators that sense different microwave-frequency bands. This scaled front-end assembly can sense microwave signals over a span of more than one octave. The width of the TEM waveguide can be tapered, as shown in FIG. 6, by a factor of 3 and still achieve low reflection loss over that frequency span. Modulators sensing different frequency bands generally have different sizes and preferably are integrated into different portions of the tapered TEM waveguide 25 such that the width of TEM waveguide 25 at the slice containing a first EO modulator sensing a first frequency band is different from the width of the TEM waveguide at a different slice containing a second EO modulator sensing a second frequency band. This versatility in frequency scaling represents a strong advantage over the prior art. The designs and construction/fabrication methods described can readily be applied by someone skilled in the art to obtain front ends assemblies that operate at frequencies ranging from UHF to Ka-Band. The physical size of the TEM concentrator, the TEM waveguide and the EO modulator can be scaled accordingly to match the wavelength corresponding to these other frequencies.

Scaling to Phased Arrays

The aperture of a preferred front-end EM-field sensor assembly 10 has a size (in width and height) of approximately one-half the free-space wavelength of the microwave signal to be sensed and the assembly has a size of typically around 0.5 to 1 free-space wavelength in depth. When the front-end sensor assembly 10 is implemented as a stand alone EM-field sensor element, such elements can be arrayed to increase the amount of signal that can be sensed (see FIGS. 13a and 13b). Horn antennas 50 are preferably used to collect and concentrate the incident EM energy and TEM expanders 70 are also preferably utilized.

Figure 13A:
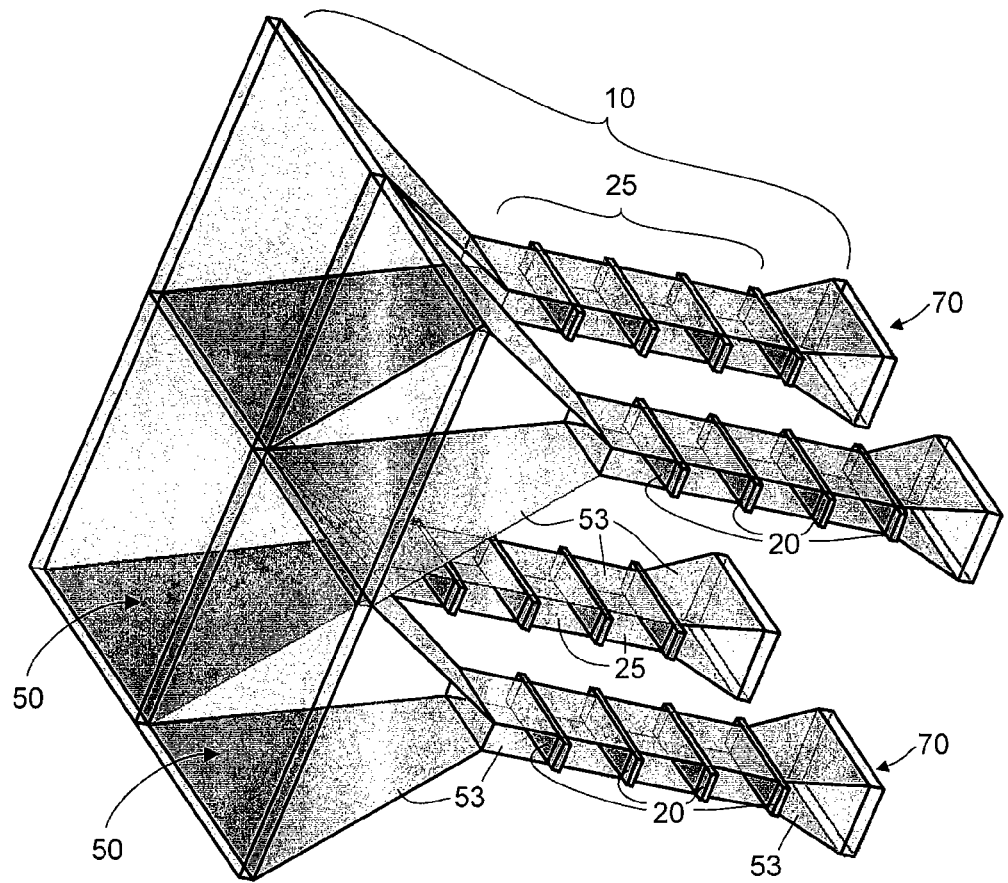
FIGS. 13a and 13b depict a phased array of horn/waveguide/modulator sensor elements having a steerable far-field beam and improved signal-to-noise, without reducing its tolerance to high-power microwave radiation.
Figure 13B:
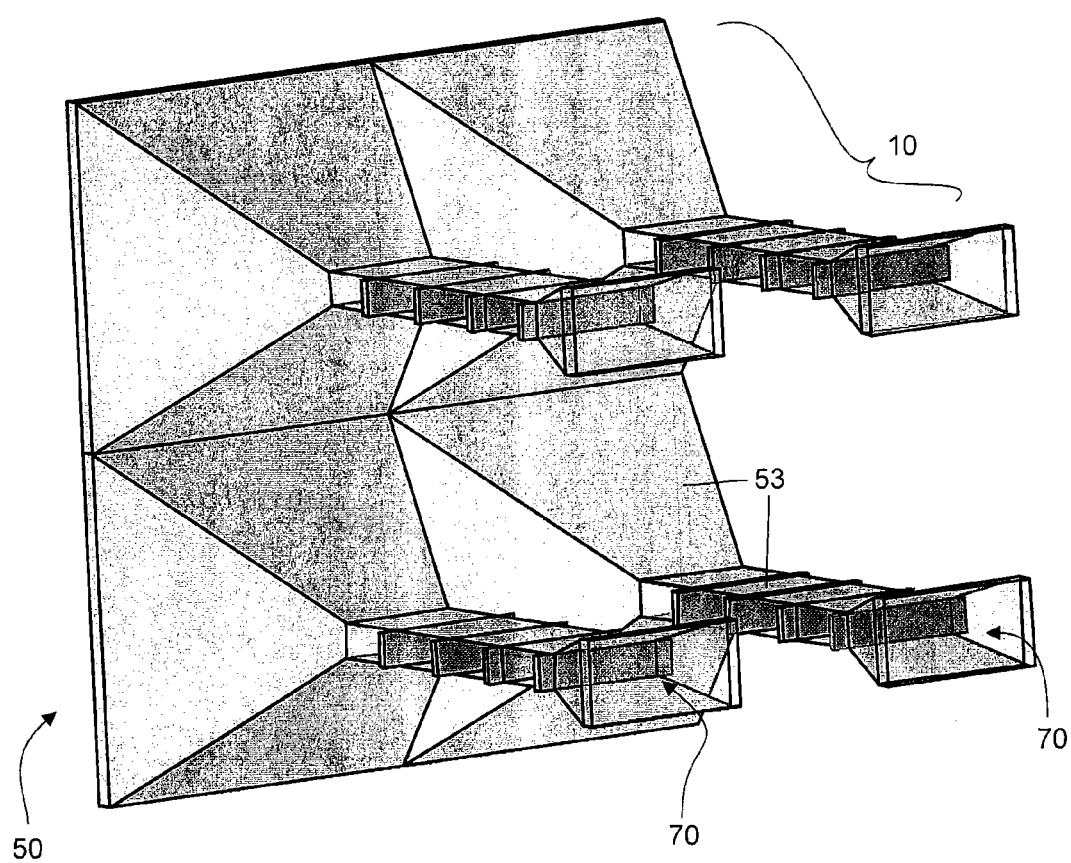

FIGS. 13a and 13b depict a phased array 80 of horn/waveguide/modulator sensor elements 10 having a steerable far-field beam and improved signal-to-noise, without reducing its tolerance to high-power microwave radiation. Depicted is a 2×2 array of sensor elements 10, but the number of sensors 10 in the array 80 may be increased many fold if desired. Each element 10 is preferably one-half of a wavelength of the anticipated incident EM signal and the spacing of elements 10 from one another is also preferably one-half of a wavelength. All of the elements 10 are preferably directly adjacent to one another. Not shown in these figures are the optical fibers connecting the modulators 20 to the laser light sources and photo detectors which are preferably placed in EM shielded electronic enclosures 40 as discussed previously herein.

With such an array 80, each spatial portion of the incident EM field is sensed separately by the individual sensor elements. The energy in the various portions of incident EM field is not directly combined to produce the receiver signal. Thus, the unwanted high EM-radiation power tolerance level is not compromised by the arraying. Instead, it is the electrical, photodetected signals derived from the optical outputs of the EO modulators of the separate sensor assembly elements that are combined inside the EM shielding enclosure 40 depicted in FIGS. 1 and 2. The strength of these signals are self-limited by the laser power supplied in the MWP link, so the front-end electronics in enclosure 40 will not be saturated or damaged by intense microwave EM inputs.

One benefit of a front end comprising an array of the EM field sensor assemblies 10 is improved sensitivity. The signal-to-noise ratio can be increased by a factor of N for an N×N array of sensor elements 10 combined in parallel. The electrical connection that needs to be made to the N×N array front end is similar to the electrical connection typically made to an N×N antenna array. Thus, it is possible to directly replace a prior art array antenna with an array of the passive EM field sensor front-ends 10 as described herein. An additional benefit of a scaled phased array of multiple front-end EM field sensor elements is its far-field beam pattern that can be steered and shaped using standard phased array beam forming techniques that are well known to someone skilled in the art.

Figure 14:
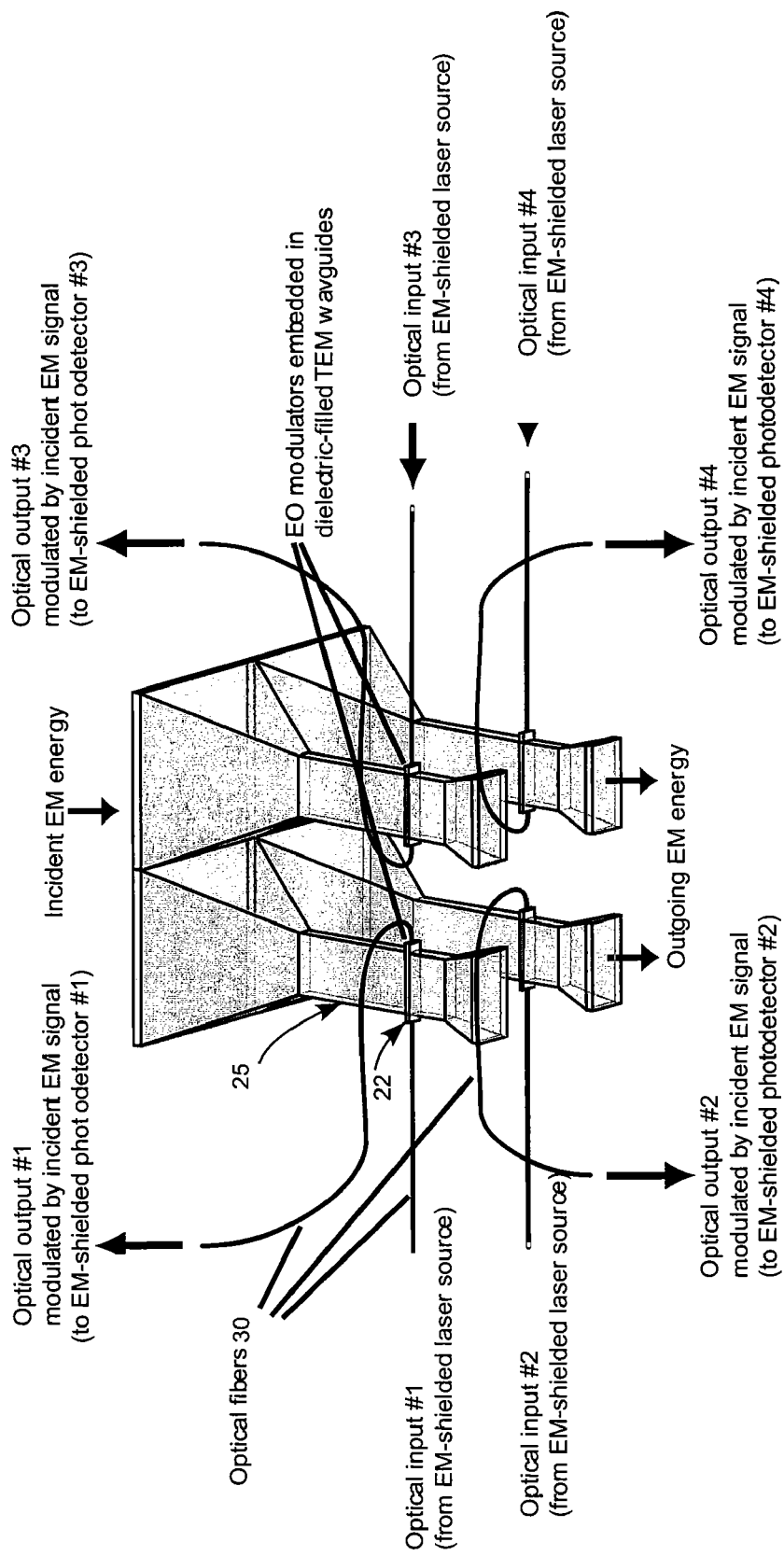
FIG. 14 shows a front-end assembly array of sensor head elements whose EO modulators are connected in parallel. The input TEM microwave waveguides of these sensor head elements all have the same electrical length. The modulated signals are connected to an array of photodetectors, with the multiple channels of RF-photonic link combined in parallel.

One preferred embodiment is to have the EO modulators 20 of an array of many microwave receiver front-end assemblies 10 connected in parallel, as illustrated in FIG. 14. The light from one or more lasers is split into parallel fiber channels and the output from each modulator is connected to an array of photo detectors in the EM-shielded receiver 40 (not shown in FIG. 14, but shown in FIG. 2). In this case the TEM waveguides 25 have the same length prior to the modulator-containing slice 22 and those TEM waveguides may be connected to individual TEM horn antennas.

Figure 15:
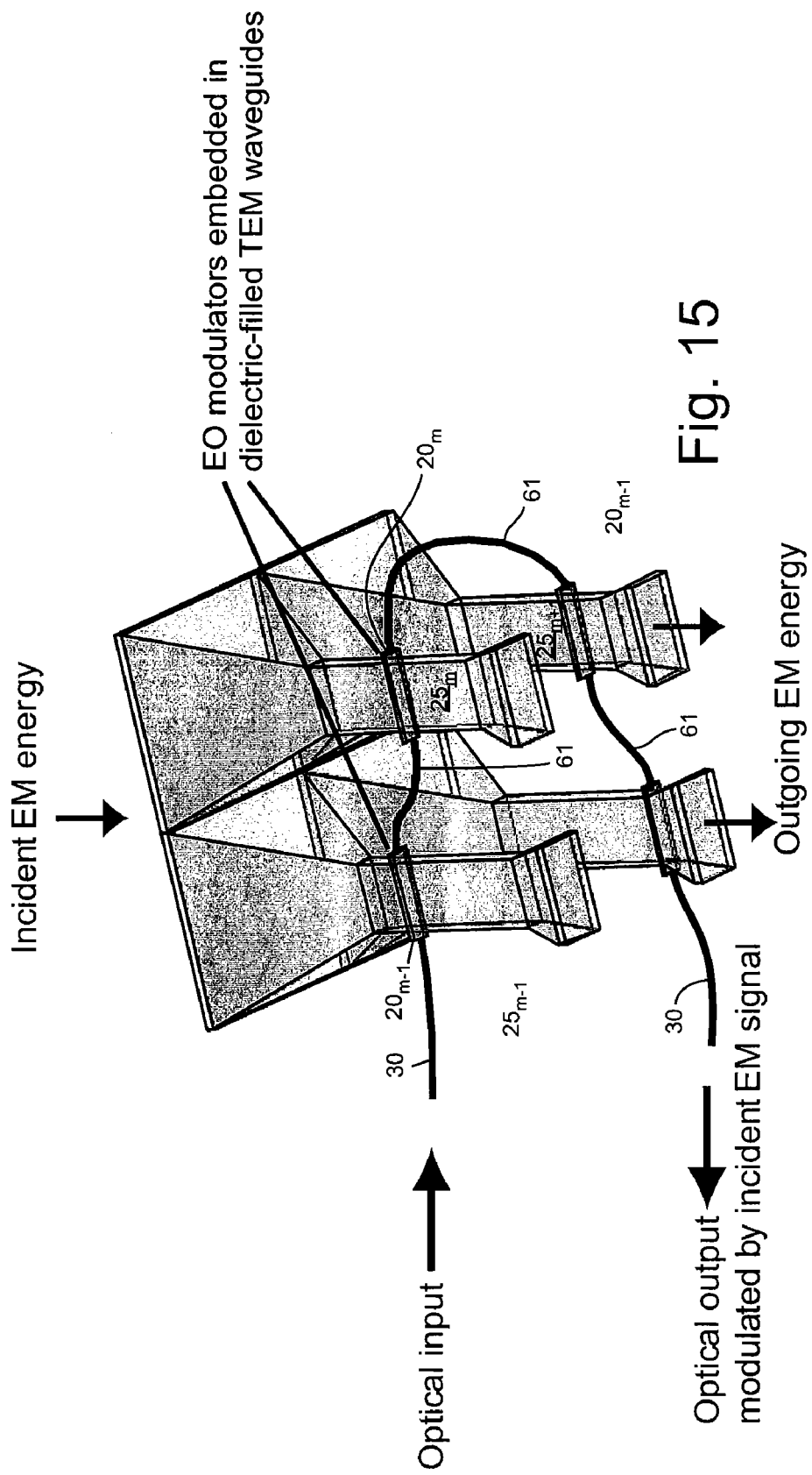
FIG. 15 depicts a front-end assembly array of sensor elements whose antennas are arranged in parallel but whose electrooptic modulators are connected in series. The various horn and TEM waveguide combinations have different effective electrical lengths in order to phase match or time synchronize the RF signal arriving at a modulator with the modulated light arriving at the same modulator.

In a separate array configuration embodiment, the optical outputs of the EO modulators of multiple microwave receiver front-end assemblies are connected in series in order to enhance the depth of modulation of the optical signal. FIG. 15 depicts the serially connected case of a 2×2 array in which each TEM microwave receiver front-end assembly element of the array contains only one EO modulator. The modulators can be connected in series using optical fibers of a specific length, or else separate pieces of substrate with integrated optic waveguides can be attached to the modulator substrates. An optical signal from a laser enters the modulator array and travels through each modulator sequentially. Each modulator $20_{m-1,m,m+1}$ is embedded in a separate dielectric-filled TEM waveguide $25_{m-1,m,m+1}$, and each TEM waveguide $25_{m-1,m,m+1}$ is connected to a different antenna array element, such as a TEM horn $50_{m-1,m,m+1}$. The array of TEM microwave waveguides $25_{m-1,m,m+1}$ must have an electrical length progression for those waveguide portions between the antenna elements $50_{m-1,m,m+1}$ and the slices $22_{m-1,m,m+1}$ containing the modulators $20_{m-1,m,m+1}$, such that the time delay difference for the RF signal supplied to successive optoelectronic modulators of the series connection of modulators is given by $$\Delta T = \frac{L_{modulator}}{v_{g,modulator}} + \frac{L_{interconnect}}{v_{g,interconnect}} \qquad \text{(eqn. 6)}$$

wherein $L_{modulator}$ is the length of a modulator, $L_{interconnect}$ is the length of the optical interconnect (such as optical fibers 61) between modulators, $v_{g,modulator}$ is the group velocity of the light in the integrated optic waveguide of the modulator, $v_{g,interconnect}$ is the group velocity of the light in the optical interconnect 61 between modulators. In other words, for successively connected modulators $20_{m-1}$ and $20_m$ in an array of microwave receiver front-end assemblies 10, the length of the portion of TEM microwave waveguide $25_m$ that occurs between its antenna and the modulator containing slice $22_m$ of that waveguide, must be longer than the length of the portion of TEM waveguide $25_{m-1}$ that occurs between its antenna and the modulator containing slice $22_{m-1}$, in order to achieve an in-phase increase in the depth of modulation of the resultant optical signal. The arrangement of array elements can be in-line (1D configuration) but also can have any 2D configuration, such as the 2×2 square array depicted in FIG. 15.

As discussed above, the optical signal preferably makes a full complete pass through the entire length of the modulator in a given array element in a time shorter than one-half period of the microwave modulating signal. The maximum length of the modulator, which can be longer than the physical width of the microwave-waveguide slice containing that modulator, is given by $$L_{modulator} = c \frac{\Delta t_{modulator}}{n_{modulator}} \qquad \text{(eqn. 7)}$$

wherein $L_{modulator}$ can be as large as one-half the period of the RF signal. The time the light spends in each fiber interconnection is dependent on the length of the fiber interconnection and is given by $$\Delta t_{interconnect} = \frac{L_{interconnect} \, n_{interconnect}}{c} \qquad \text{(eqn. 8)}$$

Thus, the incremental electrical-delay length between for the leading portions of the TEM waveguides containing successively connected modulators of the series connection of modulators is constrained to be $$\Delta L_{waveguide} = (\Delta t_{modulator} + \Delta t_{interconnect}) \left( \frac{c}{\sqrt{\varepsilon_{RF}}} \right) \qquad \text{(eqn. 9)}$$

As these relations suggest, the length of the fiber interconnection between modulators and the incremental electrical-delay length of the microwave field in the leading portion of a TEM waveguide before that field reaches the modulator-containing slice can be adjusted to match the time delays of the microwave field and the light reaching a modulator.

It should be understood that the above-described embodiments are merely some possible examples of implementations of the presently disclosed technology, set forth for a clearer understanding of the principles of this disclosure.

Many variations and modifications may be made to the above-described embodiments of the invention without departing substantially from the principles of the invention. All such modifications and variations are intended to be included herein within the scope of this disclosure and the present invention and protected by the following claims.

The invention claimed is:

1. A receiver front-end assembly comprising:
   a. a metal-bounded dielectric-filled transverse electromagnetic waveguide for guiding a propagating electromagnetic field through said transverse electromagnetic waveguide, said transverse electromagnetic waveguide having two opposing metal surfaces,
   b. an electromagnetic field concentrating antenna for coupling incident electromagnetic radiation into said transverse electromagnetic waveguide,
   c. at least one slice of an electro-optic material embedded in the metal-bounded dielectric-filled transverse electromagnetic waveguide, the electro-optic material embedded in the metal-bounded dielectric-filled transverse electromagnetic waveguide having at least one optical waveguide having at least a major portion thereof guiding light in a direction orthogonal with respect to a direction in which the metal-bounded dielectric-filled transverse electromagnetic waveguide guides an electromagnetic field propagating in said transverse electromagnetic waveguide; and
   d. at least one integrated electro-optic waveguide modulator disposed on or in the at least one slice of electro-optic material, said modulator including at least a portion of said at least one optical waveguide, a portion of said two opposing metal surfaces of said metal-bounded dielectric-filled transverse electromagnetic waveguide serving as driving electrodes for said modulator.

2. The receiver front-end assembly of claim 1 in combination with an RF-photonic link comprising:
   a. at least one laser light source,
   b. light guiding means for coupling laser light from said at least one laser light source to the at least one integrated electro-optic waveguide modulator for producing modulated light thereby;
   c. at least one photodetector,
   d. light guiding means for coupling the modulated laser light from the at least one integrated electro-optic waveguide modulator to the at least one photodetector.

3. The receiver front-end assembly of claim 2 wherein the at least one laser light source and the at least one photodetector are disposed in an electromagnetic-radiation tolerant enclosure so that the electromagnetic field concentrating antenna, the metal-bounded dielectric-filled transverse electromagnetic waveguide and the at least one integrated electro-optic waveguide modulator may be subjected to environmental electromagnetic fields while protecting from said environmental electromagnetic fields the at least one laser light source and the at least one photodetector disposed in the electromagnetic radiation-tolerant vessel.

4. The receiver front-end assembly of claim 3 wherein the electromagnetic-radiation tolerant enclosure has openings for passing light through from the outside of the enclosure to the inside of the enclosure, said openings having a diameter that is smaller than 0.25 mm.

5. The receiver front-end assembly of claim 1 wherein the electromagnetic field concentrating antenna is a transverse electromagnetic horn antenna having a pair of opposing electrically conductive surfaces forming a portion of a horn of said horn antenna, the metal-bounded dielectric-filled transverse electromagnetic waveguide and transverse electromagnetic horn antenna serving as an incident electromagnetic field concentrator and wherein the metal-bounded dielectric-filled transverse electromagnetic waveguide has metal surfaces ohmically coupled to the pair of opposing electrically conductive surfaces of said horn antenna for serving as driving electrodes of the at least one integrated electro-optic waveguide modulator.

6. The receiver front-end assembly of claim 5 wherein the electromagnetic field concentrating horn antenna has a square aperture at an inlet thereof, the square aperture having four sides each of which has a length equal to at most one-half of the wavelength of a frequency of an electromagnetic signal to be sensed by the front-end assembly.

7. The receiver front-end assembly of claim 5 wherein the horn antenna is filled with a dielectric material having the same dielectric constant as the dielectric of the dielectric-filled transverse electromagnetic waveguide and wherein at least one dielectric matching layer is disposed at the inlet of said horn antenna.

8. The receiver front-end assembly of claim 5 wherein the horn antenna is filled with a dielectric material having a different dielectric constant than the dielectric of the dielectric-filled transverse electromagnetic waveguide and wherein at least one dielectric matching layer is disposed between the dielectric of the horn antenna and the dielectric of the dielectric-filled transverse electromagnetic waveguide.

9. The receiver front-end assembly of claim 1 wherein the metal-bounded dielectric-filled transverse electromagnetic waveguide is rectangular in cross section with metal disposed on two opposing surfaces thereof and having two opposing surfaces free of metal to provide access for coupling optical fibers to the at least one integrated electro-optic waveguide modulator disposed on or in the at least one slice of electro-optic material in said metal-bounded dielectric-filled transverse electromagnetic waveguide.

10. The receiver front-end assembly of claim 1 wherein the at least one integrated electro-optic waveguide modulator disposed on or in the at least one slice of electro-optic material includes a Bragg grating.

11. The receiver front-end assembly of claim 1 wherein the at least one integrated electro-optic waveguide modulator disposed on or in the at least one slice of electro-optic material includes a Fabry-Perot cavity.

12. The receiver front-end assembly of claim 1 wherein the at least one integrated electro-optic waveguide modulator disposed on or in the at least one slice of electro-optic material includes an electro-optic phase modulator.

13. The receiver front-end assembly of claim 1 wherein the electromagnetic field concentrating antenna is a non-TEM horn antenna.

14. The receiver front-end assembly of claim 1 wherein the electromagnetic field concentrating antenna is a dish antenna.

15. The receiver front-end assembly of claim 1 wherein the electromagnetic field concentrating antenna is a dielectric rod antenna.

16. The receiver front-end assembly of claim 1 wherein the at least one integrated electro-optic waveguide modulator comprises a plurality of integrated electro-optic waveguide modulators disposed on or in the at least one slice of electro-optic material in said metal-bounded dielectric-filled transverse electromagnetic waveguide, said modulators being sensitive to different frequency ranges of electromagnetic radiation.

17. The receiver front-end assembly of claim 16 wherein a width of said transverse electromagnetic waveguide, on sides thereof having said two opposing metal surfaces, is different for at least two different positions along a length of said transverse electromagnetic waveguide, a first of said plurality of integrated electro-optic modulators being located at a first position in said transverse electromagnetic waveguide, said waveguide having a first width at said first position, and a second of said plurality of integrated electro-optic modulators being located at a second position in said transverse electromagnetic waveguide, said waveguide having a second width at said second position.

18. The receiver front-end assembly of claim 1 comprising a two dimensional array of said metal-bounded dielectric-filled transverse electromagnetic waveguides and associated electromagnetic field concentrating antennas for coupling incident electromagnetic radiation upon said array into said transverse electromagnetic waveguides.

19. A method of sensing incident electro-magnetic radiation, said method comprising:
   a. providing at least one sensor head in which the incident radiation passes through or is reflected from said at least one sensor head;
   b. passively sensing the incident radiation with an electro-optic material disposed in a RF waveguide propagating the incident radiation, and producing, according to an electric field component of said propagating radiation, modulation of light,
   c. providing a remote enclosure for housing electronic and optical elements associated with said at least one sensor head, the electronic and optical elements including at least one laser for supplying light to said sensor head and at least one photodetector for converting modulated light from said sensor head to an electrical signal,
   d. providing at least one optical fiber for communicating signals between (i) said electronic and optical elements in said remote enclosure and (ii) said at least one sensor head, wherein said signals communicating between (i) said electronic and optical elements and (ii) said at least one sensor head over said at least one optical fiber constitute the only signals communicating between (i) said electronic and optical elements in said remote enclosure and (ii) said at least one sensor head.

20. The method of claim 19 further including:
   a. disposing multiple optoelectronic modulators into a single transverse electromagnetic waveguide disposed in said at least one sensor head;
   b. supplying light from said at least one laser to said multiple optoelectronic modulators via said at least one optical fiber and supplying modulated light from said multiple optoelectronic modulators to said at least one photodetector via said at least one fiber; and
   c. locating a first optoelectronic modulator of said multiple optoelectronic modulators in a first portion of said single transverse electromagnetic waveguide and locating a second optoelectronic modulator in a second portion of said single transverse electromagnetic waveguide.

21. The method of claim 19 further including disposing at least one optoelectronic modulator on or in at least one slice of electro-optic material in said waveguide, said at least one modulator being disposed in said RF waveguide and having at least one optical waveguide therein with at least a major portion of said at least one optical waveguide guiding light in a direction orthogonal with respect to a direction in which the RF waveguide guides the incident radiation propagating in said RF waveguide.

22. The method of claim 19 wherein said at least one sensor head causes negligible absorption of the incident radiation.

23. A method of modulating an optical carrier by an incident electromagnetic field comprising the steps of:
   a. coupling the incident electromagnetic field into at least one transverse electromagnetic waveguide,
   b. propagating the electromagnetic field through said at least one transverse electromagnetic waveguide, each of said at least one transverse electromagnetic waveguide having two opposing metal surfaces,
   c. disposing at least one modulator on or in at least one slice of an electro-optic material in each of said at least one transverse electromagnetic waveguide, said at least one modulator being disposed in the transverse electromagnetic waveguide and having at least one optical waveguide therein with at least a major portion of said at least one optical waveguide guiding light in a direction orthogonal with respect to a direction in which the transverse electromagnetic waveguide guides the incident electromagnetic field propagating in said transverse electromagnetic waveguide; and
   d. applying light to said at least one optical waveguide in the at least one modulator, a portion of said two opposing metal surfaces of said at least one transverse electromagnetic waveguide in which said at least one modulator is disposed serving as driving electrodes for said at least one modulator.

24. The method of claim 23 further including:
   a. providing a source of light remote from said at least modulator,
   b. guiding light from said source to the at least one modulator,
   c. providing at least one photodetector, and
   d. guiding light from the at least one modulator to the at least one photodetector.

25. The method of claim 23 further including:
   guiding light, by means of an optical waveguide or optical fiber, from a first modulator disposed in a first transverse electromagnetic waveguide of said at least one transverse electromagnetic waveguide to a second modulator disposed in a second transverse electromagnetic waveguide of said at least one transverse electromagnetic waveguide.

26. The method of claim 25 wherein:
   a. said electromagnetic field propagating in said first transverse electromagnetic waveguide arrives at said first modulator after a first delay time,
   b. said electromagnetic field propagating in said second transverse electromagnetic waveguide arrives at said second modulator after a second delay time,
   c. the time difference between said first delay time and said second delay time being equal to the time taken for light to propagate through said first modulator and through said optical waveguide or optical fiber means for guiding light from said first modulator to said second modulator.

* * * * *